(12) United States Patent
Nagano

(10) Patent No.: US 8,941,017 B2
(45) Date of Patent: Jan. 27, 2015

(54) ELECTRONIC APPARATUS, METHOD OF MANUFACTURING SUBSTRATE, AND METHOD OF MANUFACTURING ELECTRONIC APPARATUS

(75) Inventor: Yoji Nagano, Chigasaki (JP)

(73) Assignee: Seiko Epson Corporation, Tokyo (JP)

( * ) Notice: Subject to any disclaimer, the term of this patent is extended or adjusted under 35 U.S.C. 154(b) by 847 days.

(21) Appl. No.: 12/984,929

(22) Filed: Jan. 5, 2011

(65) Prior Publication Data

US 2011/0174533 A1 Jul. 21, 2011

(30) Foreign Application Priority Data

Jan. 18, 2010 (JP) .................................. 2010-007862
Jan. 28, 2010 (JP) .................................. 2010-016373

(51) Int. Cl.
| | |
|---|---|
| H05K 5/04 | (2006.01) |
| H05K 5/06 | (2006.01) |
| H05K 3/34 | (2006.01) |
| H03H 9/10 | (2006.01) |
| H05K 9/00 | (2006.01) |
| H05K 1/03 | (2006.01) |
| H05K 1/11 | (2006.01) |
| H05K 3/00 | (2006.01) |

(52) U.S. Cl.
CPC ............ *H05K 3/341* (2013.01); *H03H 9/1021* (2013.01); *H05K 9/0026* (2013.01); *H05K 1/0306* (2013.01); *H05K 1/111* (2013.01); *H05K 3/0014* (2013.01); *H05K 3/0052* (2013.01); *H05K 2201/09845* (2013.01); *H05K 2201/10371* (2013.01); *H05K 2203/0108* (2013.01)
USPC ..................... 174/520; 174/50.54; 174/50.5

(58) Field of Classification Search
USPC ....................... 174/520, 50.54, 50.5
See application file for complete search history.

(56) References Cited

U.S. PATENT DOCUMENTS

| | | | | |
|---|---|---|---|---|
| 2,498,585 | A | * | 2/1950 | Seiden .......................... 310/355 |
| 2,707,781 | A | * | 5/1955 | White ......................... 340/388.7 |
| 3,203,083 | A | * | 8/1965 | Obenhaus ..................... 228/115 |
| 3,323,022 | A | * | 5/1967 | Da Costa ....................... 257/724 |
| 3,676,292 | A | * | 7/1972 | Pryor et al. .................... 428/433 |
| 3,988,825 | A | * | 11/1976 | Fuchs et al. ..................... 29/622 |
| 4,062,612 | A | * | 12/1977 | Evans ........................... 439/589 |
| 4,742,024 | A | * | 5/1988 | Sugimoto et al. ................ 29/832 |
| 4,839,716 | A | * | 6/1989 | Butt ............................. 257/660 |
| 4,906,511 | A | | 3/1990 | Sato et al. |
| 5,139,972 | A | * | 8/1992 | Neugebauer et al. ......... 438/113 |
| RE34,291 | E | * | 6/1993 | Liguori et al. ................ 361/784 |
| 5,272,797 | A | * | 12/1993 | Miyoshi ....................... 29/25.35 |
| 5,956,576 | A | * | 9/1999 | Toy et al. ..................... 438/125 |

(Continued)

FOREIGN PATENT DOCUMENTS

| | | |
|---|---|---|
| DE | 4414266 A1 * | 10/1995 |
| JP | A-01-205590 | 8/1989 |

(Continued)

*Primary Examiner* — Jeremy C Norris
*Assistant Examiner* — Nathan Milakovich
(74) *Attorney, Agent, or Firm* — Oliff PLC

(57) ABSTRACT

An electronic apparatus includes: a substrate which has a step portion in an edge portion; an electronic component which is bonded to a surface of the substrate inward of the step portion of the substrate; and a cap member which is bonded to the step portion so as to seal the electronic component, wherein a wall surface of the step portion is formed to be inclined from the step portion toward an electronic component bonding region or to be perpendicular to the step portion.

5 Claims, 16 Drawing Sheets

(56) References Cited

U.S. PATENT DOCUMENTS

| | | | |
|---|---|---|---|
| 6,549,426 B1* | 4/2003 | Lawlyes et al. | 361/816 |
| 6,708,564 B2* | 3/2004 | Ishikawa et al. | 73/493 |
| 6,778,029 B2 | 8/2004 | Mizusawa | |
| 6,871,701 B2* | 3/2005 | Ueki et al. | 165/104.26 |
| 7,121,402 B2* | 10/2006 | Van Heerden et al. | 206/222 |
| 7,143,568 B2* | 12/2006 | Van Heerden et al. | 53/486 |
| 7,240,551 B2* | 7/2007 | Hosokawa et al. | 73/493 |
| 7,358,106 B2* | 4/2008 | Potter | 438/51 |
| 7,375,974 B2* | 5/2008 | Kirigaya | 361/752 |
| 7,576,427 B2* | 8/2009 | Potter | 257/710 |
| 7,602,107 B2* | 10/2009 | Moriya et al. | 310/348 |
| 7,754,983 B2* | 7/2010 | Sunohara et al. | 174/563 |
| 7,876,033 B2* | 1/2011 | Ishizu et al. | 313/318.01 |
| 7,932,786 B2* | 4/2011 | Moriya et al. | 331/68 |
| 7,939,768 B2* | 5/2011 | Hara et al. | 174/564 |
| 8,076,576 B2* | 12/2011 | Kumatani et al. | 174/50.51 |
| 8,314,485 B2* | 11/2012 | Ono et al. | 257/708 |
| 8,530,760 B2* | 9/2013 | Taylor | 174/563 |
| 2003/0197569 A1 | 10/2003 | Mizusawa | |
| 2004/0094320 A1 | 5/2004 | Goto et al. | |
| 2005/0193548 A1 | 9/2005 | Nakazawa | |
| 2005/0279521 A1* | 12/2005 | Satullo et al. | 174/50.5 |
| 2006/0151203 A1* | 7/2006 | Krueger et al. | 174/260 |
| 2007/0120614 A1 | 5/2007 | Moriya et al. | |
| 2009/0151972 A1* | 6/2009 | Potter | 174/50.5 |
| 2009/0181297 A1* | 7/2009 | Ashizaki et al. | 429/161 |
| 2010/0013565 A1 | 1/2010 | Moriya et al. | |
| 2010/0026398 A1 | 2/2010 | Moriya et al. | |
| 2010/0046061 A1* | 2/2010 | Ichikawa et al. | 359/291 |
| 2012/0091500 A1* | 4/2012 | Matoba et al. | 257/99 |
| 2012/0263978 A1* | 10/2012 | Wang et al. | 429/7 |
| 2014/0083735 A1* | 3/2014 | Kohda et al. | 174/50.5 |

FOREIGN PATENT DOCUMENTS

| | | | |
|---|---|---|---|
| JP | A-2001-156193 | | 6/2001 |
| JP | 2002110833 A | * | 4/2002 |
| JP | A-2002-100694 | | 4/2002 |
| JP | A-2003-087071 | | 3/2003 |
| JP | A-2003-318690 | | 11/2003 |
| JP | 2004064013 A | * | 2/2004 |
| JP | A-2004-055774 | | 2/2004 |
| JP | A-2005-079656 | | 3/2005 |
| JP | A-2005-159258 | | 6/2005 |
| JP | A-2006-020001 | | 1/2006 |
| JP | A-2007-043340 | | 2/2007 |
| JP | A-2007-173975 | | 7/2007 |
| JP | A-2009-044123 | | 2/2009 |
| JP | A-2009-054742 | | 3/2009 |
| JP | A-2009-065205 | | 3/2009 |
| WO | WO 2008059693 A1 | * | 5/2008 |

* cited by examiner

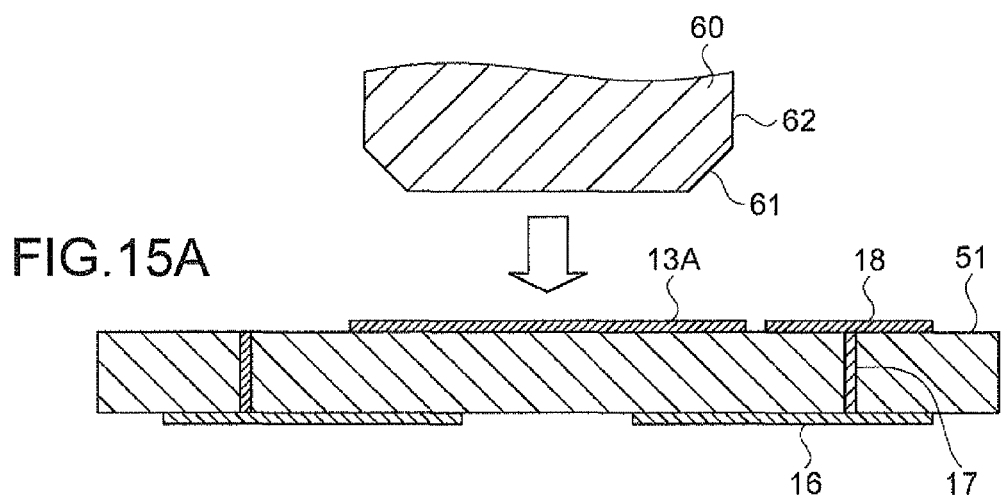
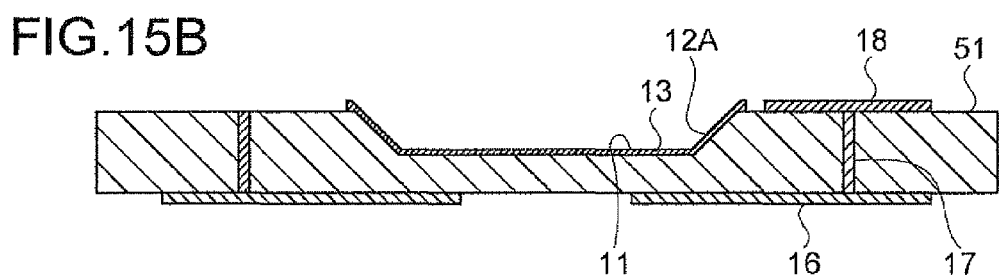

ELECTRONIC APPARATUS, METHOD OF MANUFACTURING SUBSTRATE, AND METHOD OF MANUFACTURING ELECTRONIC APPARATUS

BACKGROUND

1. Technical Field

The present invention relates to an electronic apparatus in which a cap member is bonded to a substrate with an electronic component bonded so as to seal the electronic component, a method of manufacturing a substrate, and a method of manufacturing an electronic apparatus.

2. Related Art

In the related art, a surface mounting electronic apparatus is widely used in which an electronic component bonded to a substrate is sealed by a cap member. This electronic apparatus is used as a clock source in an electronic circuit for various electronic apparatuses, for example, OA equipment and consumer equipment, such as an information communication instrument or a computer. As an example of such an electronic apparatus, a piezoelectric device is widely used in which a piezoelectric vibrating piece serving as an electronic component is bonded to a substrate and a concave cap member is bonded to the substrate so as to cover the piezoelectric vibrating piece, such that the piezoelectric vibrating piece is sealed airtight in a concave space defined by the substrate and the cap member (for example, see JP-A-2003-318690).

The piezoelectric device (quartz vibrator) described in JP-A-2003-318690 has a flat plate-shaped substrate (flat plate-shaped substrate), a piezoelectric vibrating piece (quartz piece), and a concave cap member (metal cover) having a flange. The substrate made of ceramic is provided with external mounting terminals on one main surface as an outer bottom surface of the piezoelectric device and a metal layer (metal film) in an edge portion of the other main surface. Inside the metal layer is provided with a bonding terminal (quartz terminal) to which the piezoelectric vibrating piece is bonded. One end portion of the piezoelectric vibrating piece is bonded to the bonding terminal of the substrate by a bonding member, such as a conductive adhesive, and positioned inward of the opening section of the cap member and the peripheral end of the substrate. A soldering material comes into contact with around the contact portion between the peripheral surface of the cap member and the metal layer of the substrate, and the soldering material is heated until molten for soldering. Thus, the piezoelectric vibrating piece is sealed airtight in the concave space defined by the substrate and the cap member.

However, in the piezoelectric device described in JP-A-2003-318690, the contact portion for bonding the cap member and the substrate is limited to only the opening section of the cap member. For this reason, bonding strength between the cap member and the substrate may be degraded, impact resistance or bonding strength may be deteriorated, or sealing airtightness may be degraded due to deterioration in impact resistance or bonding strength.

The cap member may be misaligned on the substrate to which the piezoelectric vibrating piece is bonded and, for example, the cap member may protrude from the periphery of the piezoelectric device, such that the dimension standard of the planar contour may not be satisfied, or bonding strength or airtightness of the cap member may be deteriorated.

SUMMARY

An advantage of some aspects of the invention is to solve at least a part of the problems described above and the invention can be implemented as the following forms or application examples.

Application Example 1

According to this application example of the invention, there is provided an electronic apparatus including a substrate which has a step portion in an edge portion, an electronic component which is bonded to a surface of the substrate inward of the step portion of the substrate, and a cap member which is bonded to the step portion so as to seal the electronic component. A wall surface of the step portion is formed to be inclined from the step portion toward an electronic component bonding region or to be perpendicular to the step portion.

With this piezoelectric device, when the cap member is bonded to the substrate so as to cover the electronic component mounted on the substrate, a bonding surface for the cap member is formed in the step portion of the substrate and the wall surface which is inclined from the step portion to the electronic component bonding region or is provided perpendicularly to the step portion. Thus, with the above-described configuration, the bonding area of the cap member to the substrate increases compared to a case where the cap is bonded to the flat surface of the substrate, improving bonding strength. Therefore, it is possible to reliably seal the electronic component airtight and to provide an electronic apparatus having excellent impact resistance against falling or the like and high reliability.

Application Example 2

In the electronic apparatus according to the application example of the invention, a connection portion of the wall surface and the step portion may have an arc-shaped sectional shape.

With this configuration, the connection portion of the wall surface and the step portion has the arc-shaped sectional shape. Therefore, stress does not easily concentrate on the connection portion of the step portion and the wall portion as a base point at which the substrate is thinned, suppressing occurrence of cracking or the like in the substrate.

Application Example 3

In the electronic apparatus according to the application example of the invention, the shape of the surface inward of the step portion may be substantially the same as the shape of an opening of the cap member in plan view.

With this configuration, the inner wall of the cap member is bonded to the wall surface of the substrate in a state of being in close contact therewith or being close thereto. Therefore, it is possible to further improve bonding strength of the substrate and the cap member.

Application Example 4

In the electronic apparatus according to the application example of the invention, the cap member may have a metal or a metal film in at least a contact portion with the substrate, and a metal layer may be formed on the wall surface and the surface of the step portion.

With this configuration, in bonding the cap member and the substrate, satisfactory bonding can be carried out more rigidly using a bonding member made of a metal or alloy.

For example, bonding (soldering) is carried out using an alloy (solder) having a melting point lower than the metal of the bonding portion of the cap member and the wall surface as the bonding member. Therefore, it is possible to carry out rigid bonding without melting the metal or metal layer of the cap member or the substrate.

Application Example 5

In the electronic apparatus according to the application example of the invention, the metal layer of the wall surface may be provided at an interval on the surface inward of the step portion.

With this configuration, for example, in bonding the substrate and the cap member through the bonding member made of a metal or alloy, it is possible to suppress flying of molten droplets of the bonding metal at the time of bonding toward the electronic component.

Application Example 6

According to this application example of the invention, there is provided a method of manufacturing a substrate having a step portion in an edge portion, and an electronic component is bonded to a surface of the substrate inward of the step portion. The method includes preparing a substrate sheet for forming the substrate, forming a wall surface of the step portion to be inclined from the step portion to an electronic component bonding region or to be perpendicular to the step portion, and forming a segmentation groove for segmenting the substrate sheet into the individual substrates.

With this configuration, it is possible to easily form the substrate in which the wall surface which is inclined from the step portion to the electronic component bonding region or is perpendicular to the step portion is provided.

The bonding surface of a connected member, such as the cap member connected to the substrate, is formed in the step portion and the wall surface. Thus, the bonding area of the connected member to the substrate increases compared to a case where the connected member is bonded to the flat surface of the substrate. The increase in the bonding area makes it possible to provide a substrate with improved bonding strength.

Application Example 7

In the method according to the application example of the invention, the forming of the wall surface of the step portion may be included in the forming of the segmentation groove.

With this configuration, forming of the wall surface of the step portion is included in the forming of the segmentation groove. Therefore, it is possible to easily form the step portion without increasing the number of steps.

Application Example 8

The method according to the application example of the invention may further include forming a conductor pattern on the substrate sheet. In the forming of the conductor pattern, the conductor pattern may be formed near at least the connection portion of the step portion and the wall surface in a portion of the substrate forming the wall surface and a portion forming the step portion.

With this configuration, the conductor pattern formed on the substrate is used as the bonding member capable of bonding metals, and the connected member and the substrate can be connected to each other through the conductor pattern. Therefore, it is possible to comparatively easily provide a substrate which is configured such that the connected member and the substrate can be rigidly bonded to each other.

Application Example 9

In the method according to the application example of the invention, an uncalcinated ceramic sheet may be used as the material for the substrate sheet. The method may further include calcinating the ceramic sheet. The calcinating of the ceramic sheet may be provided after the forming of the segmentation groove and the forming of the step portion.

With this configuration, the uncalcinated ceramic sheet has flexibility. Therefore, the forming of the segmentation groove and the forming of the step portion are performed before the calcinating of the ceramic sheet, making it possible to easily form the shape of the step portion having the inclined or perpendicular wall surface through pressing.

Application Example 10

According to this application example of the invention, there is provided a method of manufacturing an electronic apparatus including a substrate which has a step portion in an edge portion, an electronic component which is bonded to an electronic component bonding region inward of the step portion of the substrate, and a cap member which is bonded to the step portion so as to seal the electronic component. A wall surface of the step portion is a surface which is formed to be inclined from the step portion to the electronic component bonding region or to be perpendicular to the step portion. The method includes preparing a substrate sheet for forming the substrate, forming a segmentation groove for segmenting the substrate sheet into the individual substrates through pressing, bonding the electronic component to the electronic component bonding region, and bonding the cap member to the substrate so as to cover the electronic component. The forming of the step portion through pressing is included in the forming of the segmentation groove.

With this method, the bonding surface of the cap member is formed in the step portion of the substrate and the wall surface which is formed to be inclined from the step portion to the electronic component bonding region or to be perpendicular to the step portion. Therefore, it is possible to increase the bonding area of the cap member to the substrate while suppressing an increase in the area of the substrate, improving bonding strength, compared to an electronic apparatus in which the cap is bonded to the flat surface of the substrate.

Thus, in the forming of the segmentation groove, only the forming of the step portion through pressing is further provided, making it possible to manufacture an electronic apparatus which has excellent impact resistance against falling or the like and high reliability.

In the bonding of the cap member, even when a manufacturing variation occurs in the opening shape of the cap member, it is possible to manufacture an electronic apparatus in which the cap member is guided along the inclined wall surface from the electronic component bonding region to the step portion, such that the cap member can be easily positioned.

Application Example 11

In the method according to the application example of the invention, an uncalcinated ceramic sheet may be used as the material for the substrate sheet. The method may further include calcinating the ceramic sheet. The forming of the step portion may be provided before the calcinating of the ceramic sheet.

With this configuration, the uncalcinated ceramic sheet has plasticity, making it possible to easily form the shape of the step portion having the wall surface inclined from the electronic component bonding region to the edge through pressing with a pressing blade.

Application Example 12

In the method according to the application example of the invention, the step portion may have a rectangular shape in which the connection portion between the wall surfaces has an arc shape in plan view, and the forming of the step portion may include forming the step portion having a rectangular shape in plan view, and forming the connection portion between the wall surfaces in an arc shape.

With this configuration, pressing is carried out multiple times, such that the pressure at the time of single pressing is lowered. Therefore, it is possible to reduce damage to the substrate sheet and to minutely adjust the forming position for each connection portion between the wall surfaces, stabilizing the shape.

Application Example 13

In the method according to the application example of the invention, the cap member may have a metal or metal film in at least a contact portion to the substrate. The method may further include forming a conductor pattern on the substrate sheet. In the forming of the conductor pattern, the conductor pattern may be formed near at least the connection portion of the step portion and the wall surface in a portion of the substrate forming the wall surface and a portion forming the step portion.

With this configuration, it is possible to comparatively easily bond the cap member and the substrate rigidly through the bonding member capable of bonding metals.

BRIEF DESCRIPTION OF THE DRAWINGS

The invention will be described with reference to the accompanying drawings, wherein like numbers reference like elements.

FIG. 1A is a schematic plan view and FIG. 1B is a schematic sectional view taken along the line A-A of FIG. 1A.

FIG. 13A is a schematic plan view and FIG. 13B is a schematic sectional view taken along the line A-A of FIG. 13A.

FIGS. 15A and 15B are partial enlarged sectional views showing a process for manufacturing a ceramic substrate of the second embodiment.

DESCRIPTION OF EXEMPLARY EMBODIMENTS

Hereinafter, preferred embodiments of the invention will be described with reference to the drawings.

First Embodiment

First, as a first embodiment, a configuration in which a wall surface of a step portion is provided perpendicularly to the step portion will be described with reference to FIGS. 1A to 13B.

Piezoelectric Device

Figure 1A:
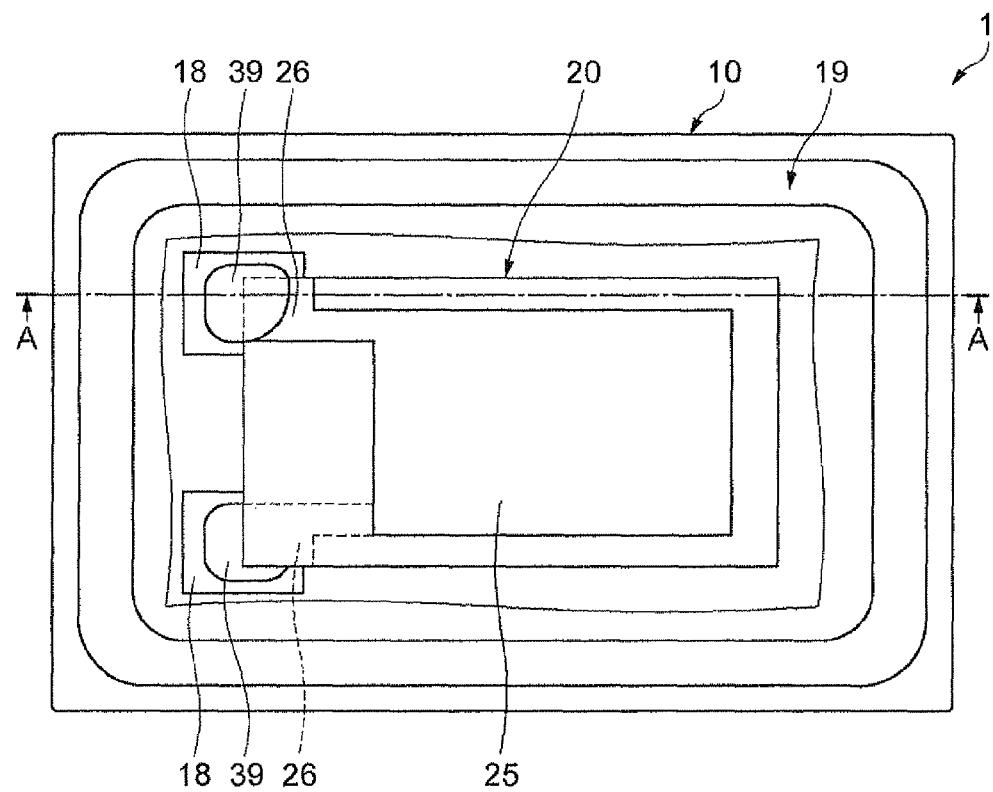
FIGS. 1A and 1B show a first embodiment of a piezoelectric device as an electronic apparatus, and specifically.
Figure 1B:
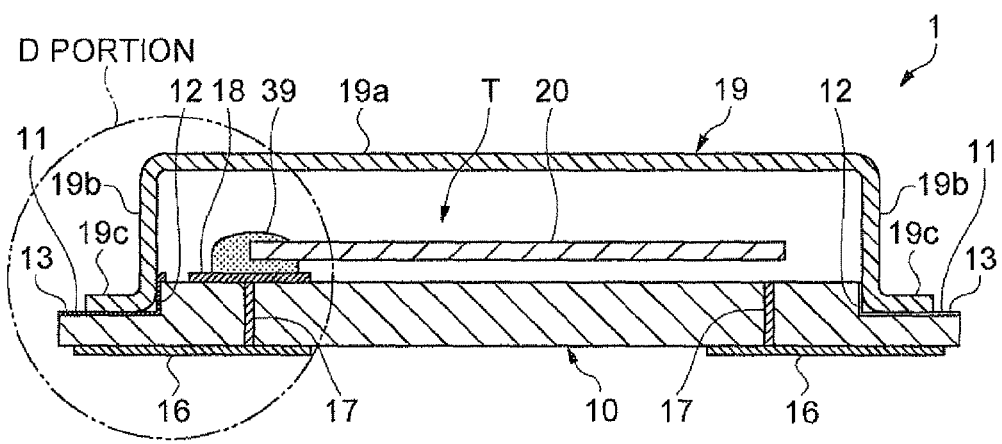
Figure 2:
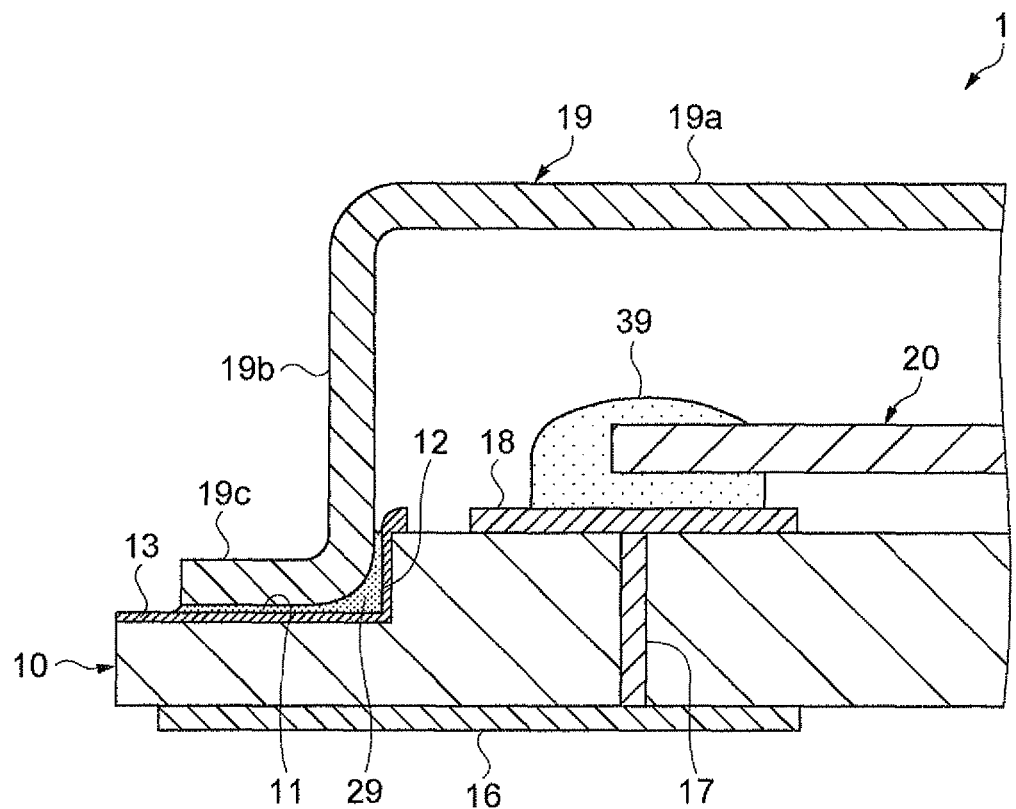
FIG. 2 is a partial sectional view specifically illustrating a D portion of FIG. 1B on a magnified scale.

FIGS. 1A and 1B illustrate an embodiment of a piezoelectric device as an electronic apparatus. FIG. 1A is a schematic plan view when viewed from above and FIG. 1B is a schematic sectional view taken along the line A-A of FIG. 1A. For convenience in describing the internal structure of the piezoelectric device, a cap member (19) provided above the piezoelectric device is shown as partially cut away in FIG. 1A. FIG. 2 is a partial sectional view specifically illustrating a D portion of FIG. 1B on a magnified scale.

Referring to FIGS. 1A and 1B, a piezoelectric device 1 has a ceramic substrate 10 as a substrate, a piezoelectric vibrating piece 20 as an electronic component bonded to an electronic component bonding region on the ceramic substrate 10, and a concave cap member 19 bonded to the ceramic substrate 10 so as to cover the piezoelectric vibrating piece 20. The piezoelectric vibrating piece 20 is sealed airtight in a cavity T defined by the ceramic substrate 10 and the cap member 19 (connected member).

The ceramic substrate 10 has a plurality of external mounting terminals 16 on one main surface of a flat plate-shaped insulating base material and vibrating piece bonding terminals 18, to which the piezoelectric vibrating piece 20 is bonded, on the other main surface. The vibrating piece bonding terminals 18 and other terminals (not shown) are correspondingly connected to the external mounting terminals 16 through in-layer wiring lines (vias) 17 formed by burying conductor paste containing a high-melting-point metal in through holes (via holes) provided in the ceramic substrate 10.

The one main surface of the ceramic substrate 10 on which the external mounting terminals 16 are provided becomes the outer bottom surface of the piezoelectric device 1. With the external mounting terminals 16 provided on the outer bottom surface, the piezoelectric device 1 can be mounted on an external mounting substrate of an electronic apparatus or the like. The ceramic substrate 10 of this embodiment is formed by molding and machining a green sheet for a ceramic substrate and performing calcination (the details will be described below).

In the edge portion of the surface (the other main surface) of the vibrating piece bonding region as an electronic component bonding region on which the vibrating piece bonding terminals 18 of the ceramic substrate 10 are provided, a step portion 11 is formed which is substantially parallel to the other main surface, surrounds the vibrating piece bonding region, and has a surface lower than the surface of the vibrating piece bonding region. In other words, the surface of the step portion 11 on the other main surface is formed with a decreasing (thinning) thickness based on the one main surface of the insulating base material compared to the surface of the main surface of the vibrating piece bonding region. A wall surface 12 having a step defined by the step portion 11 and the other main surface is provided perpendicularly to the step portion 11.

Figure 10A:
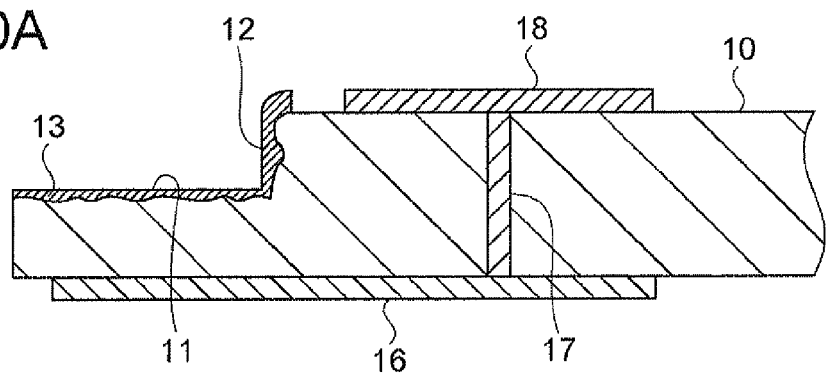
FIGS. 10A and 10B are partial sectional views illustrating variations in the surface shape of the step portion and the wall surface of the ceramic substrate.
Figure 10B:
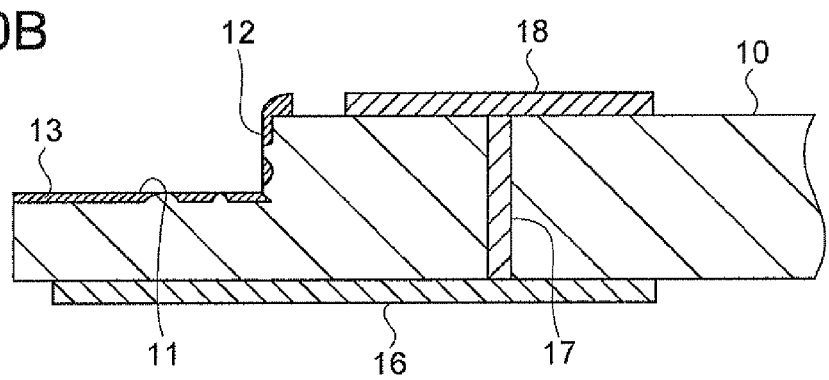

A metal layer 13 is provided on the surface of the step portion 11 and on the wall surface 12. The positional relationship between the surface of the step portion 11 substantially formed in parallel to the other main surface and the wall surface 12 provided perpendicularly to the step portion 11 indicates the positional relationship including the metal layer 13 provided on the respective surfaces. For example, as shown in FIGS. 10A and 10B, even when there is unevenness in the base material of the ceramic substrate 10 of the step portion 11 and the wall surface 12, it should suffice that the surfaces of the metal layer 13 provided on the step portion 11 and the wall surface 12 are perpendicular to each other. Specifically, as shown in FIG. 10A, even when there is unevenness in the surface of the step portion 11 or the wall surface 12 of the ceramic substrate 10, it should suffice that the surfaces of the metal layer 13 provided on the step portion 11 and the wall surface 12 are substantially flat and the surfaces are positioned to be perpendicular to each other. As shown in FIG. 10B, even when a portion of the step portion 11 or the wall surface 12 is exposed from the metal layer 13 provided on the step portion 11 or the wall surface 12, it should suffice that the surfaces of the step portion 11 and the wall surface 12 with the metal layer 13 formed are substantially flat and the surfaces are positioned to be perpendicular to each other.

The piezoelectric vibrating piece 20 is provided with, for example, excitation electrodes 25 as counter electrodes on both main surfaces of a flat plate-shaped piezoelectric substrate made of, for example, a piezoelectric material, such as quartz. An external connection electrode 26 is provided in one end portion of each main surface of the piezoelectric vibrating piece 20 and is electrically connected to an inter-electrode wiring line led from the corresponding excitation electrode 25. Examples of the material for the piezoelectric vibrating piece 20 includes piezoelectric materials other than quartz, such as lithium tantalate and lithium niobate, and materials other than piezoelectric materials, such as silicon.

On the ceramic substrate 10 (the other main surface), the piezoelectric vibrating piece 20 is bonded while being electrically connected to the vibrating piece bonding terminals 18 through a bonding member 39, such as silver paste, in a state where the external connection electrode 26 provided at one end is aligned with the corresponding vibrating piece bonding terminal 18 of the ceramic substrate 10. The other end of the piezoelectric vibrating piece 20 is supported in a cantilever manner as a free end.

The concave cap member 19 is formed by molding a plate material made of, for example, 42 alloy or kobar alloy, or a metal, such as phosphor bronze, through known sheet-metal processing in the related art. A concave portion is formed in the central portion of the cap member 19, and a flange-shaped contact leg portion 19c is formed annularly in a peripheral portion. That is, the cap member 19 has a horizontal portion 19a in the central portion, a sidewall portion 19b which is first bent in a vertical direction on the periphery of the horizontal portion 19a, and the annular contact leg portion 19c which is bent perpendicularly from the sidewall portion 19b toward the periphery and substantially parallel to the horizontal portion 19a in the peripheral portion of the cap member 19.

The cap member 19 is bonded such that the contact leg portion 19c is opposite the step portion 11 of the ceramic substrate 10 in a state where the opening of the concave portion defined by the horizontal portion 19a and the sidewall portion 19b turns toward the ceramic substrate 10.

In this embodiment, as shown in FIG. 2, the metal layer 13 on the step portion 11 and the wall surface 12 of the ceramic substrate 10 are bonded to the lower surface of the contact leg portion 19c of the cap member 19 and around the contact leg portion 19c inward of the lateral surface (near the concave portion) through a soldering material 29 as a bonding member. The soldering material 29 is made of an alloy having a comparatively low melting point. The piezoelectric vibrating piece 20 is accommodated in the cavity T surrounded by the concave portion and the bonding surface of the ceramic substrate 10 for the piezoelectric vibrating piece 20, such that the cap member 19 seals the mounting region of the piezoelectric vibrating piece 20 airtight.

In the piezoelectric device 1 of this embodiment, the shape of the step portion 11 in the edge portion of the ceramic substrate 10 is substantially the same as the shape of the opening of the cap member 19 in plan view. That is, the cap member 19 is guided along the wall surface 12 and engaged with a convex portion defined by wall surface 12 and the bonding surface for the piezoelectric vibrating piece 20, such that the cap member 19 can be placed on the ceramic substrate 10. Thus, the contact leg portion 19c of the cap member 19 is bonded to the step portion 11 of the ceramic substrate 10, and the wall surface 12 is also bonded to the sidewall portion 19b, compared to the known ceramic substrate in which the cap member is bonded to the flat surface. Therefore, it is possible to improve bonding strength of the cap member 19 to the ceramic substrate 10 and to reliably seal the piezoelectric vibrating piece 20 airtight.

It is preferable that the cap member 19 is electrically connected to the ground terminal (not shown) of the ceramic substrate 10 through the metal layer 13 provided on the step portion 11 and the wall surface 12. When this happens, at the time of using the piezoelectric device 1, the cap member 19 made of a metal is maintained at the ground potential, such that the piezoelectric vibrating piece 20 can be protected from unnecessary electrical actions from the outside, for example, noise because of the shield effect of the cap member 19.

In the above-described piezoelectric device 1, a swing voltage from the outside is applied between the excitation electrodes 25 provided on both the main surfaces of the piezoelectric vibrating piece 20 through the external mounting terminals 16 provided on the bottom surface of the ceramic substrate 10. Thus, vibration is generated at a predetermined frequency in accordance with the characteristics of the piezoelectric vibrating piece 20. As such, the piezoelectric vibrating piece 20 vibrates at a predetermined frequency to function as the piezoelectric device 1, and can oscillate and output a reference signal at a predetermined frequency on the basis of the resonance frequency of the piezoelectric device 1 by an external oscillation circuit. The reference signal can be used as a clock signal in an electronic apparatus, such as a portable communication instrument.

Method of Manufacturing Piezoelectric Device

Next, a method of manufacturing the piezoelectric device 1 configured as above will be described with reference to the drawings particularly focusing on a method of manufacturing the ceramic substrate 10 as a substrate.

Figure 3:
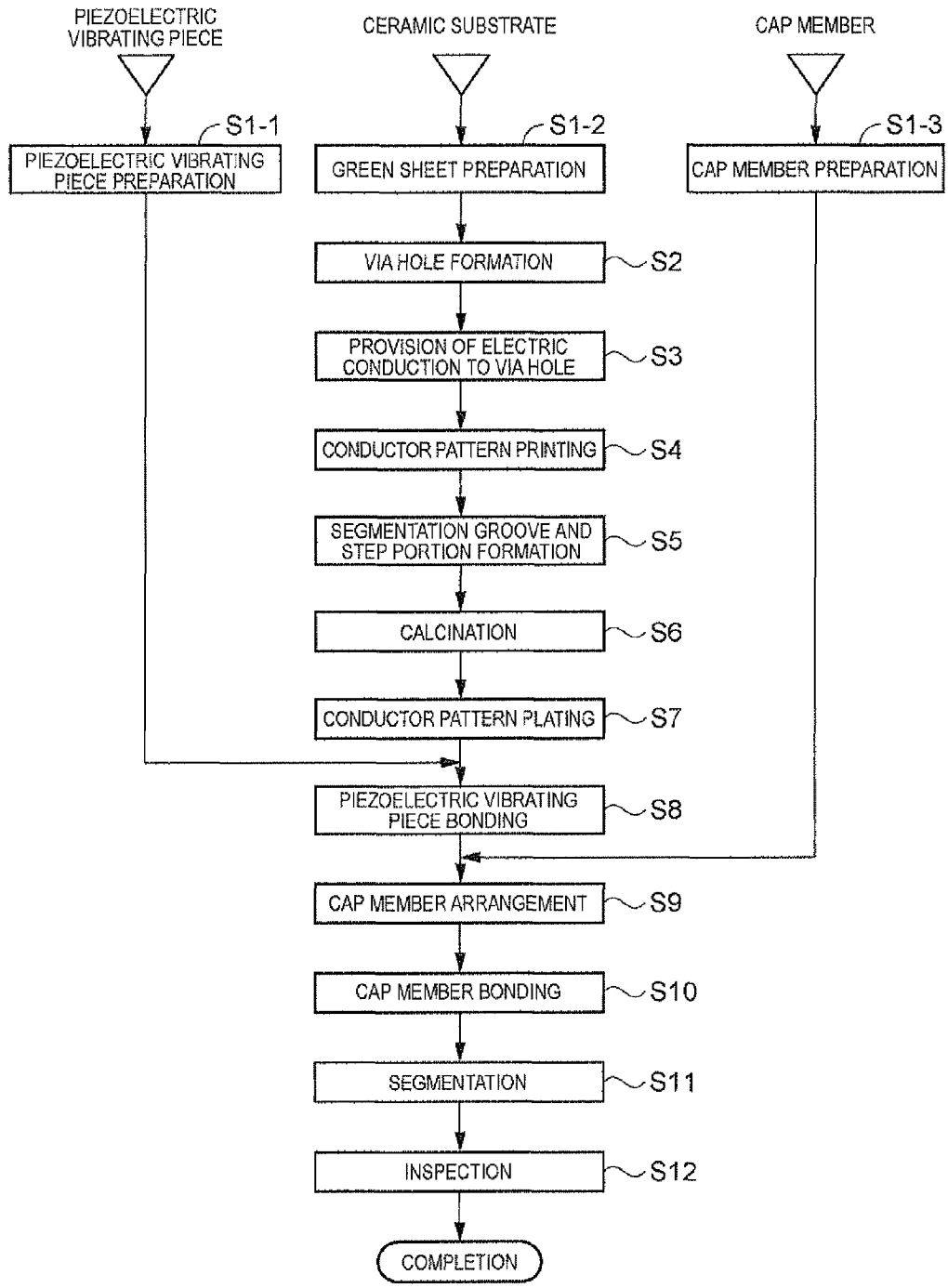
FIG. 3 is a flowchart illustrating a method of manufacturing a piezoelectric device of the first embodiment.

FIG. 3 is a flowchart illustrating one embodiment of the method of manufacturing the piezoelectric device 1.

FIGS. 4 to 9D schematically show a process for collectively manufacturing a plurality of ceramic substrates from a green sheet. FIGS. 4, 5, and 8A and 8B are schematic plan views, and FIGS. 6A to 6D, 7A to 7D, and 9A to 9D are partial sectional views illustrating the same section as in FIG. 2 on a magnified scale.

The manufacturing process of the piezoelectric device 1 can be divided broadly into a preceding process for preparing the piezoelectric vibrating piece 20, the ceramic substrate 10, and the cap member 19, and a subsequent process (assembling process) for bonding the piezoelectric vibrating piece 20 to the ceramic substrate and then bonding the cap member 19 to seal the piezoelectric vibrating piece 20 airtight. First, in the preceding process, the preparation of the piezoelectric vibrating piece 20 and the cap member 19 will be described schematically with reference to FIG. 3.

In the preparation of the piezoelectric vibrating piece 20 of Step S1-1, the piezoelectric vibrating piece 20 is manufactured in the form such that the piezoelectric device 1 can be assembled. With regard to the piezoelectric vibrating piece 20, from example, a plurality of piezoelectric vibrating pieces 20 can be formed collectively to be arranged in a large wafer obtained by cutting a piezoelectric material, such as quartz, of a predetermined size and polishing the piezoelectric material.

In summary, first, a large quartz substrate (quartz wafer) is prepared which is cut at a predetermined cut angle with respect to the crystal axis and polished to have desired thickness and surface state. The contour of a plurality of piezoelectric vibrating pieces 20 is formed in the quartz substrate through wet etching using photolithography. It is preferable that the contour of the piezoelectric vibrating pieces 20 is connected to the quartz wafer by a perforated folding and cutting portion or the like so as to be not completely cut off from the quartz substrate, and the quartz substrate (wafer) will be efficiently subjected to the subsequent process as it is. Electrodes, such as the excitation electrodes 25 or the external connection electrodes 26, are formed through sputtering or vapor deposition. Thus, a plurality of piezoelectric vibrating pieces 20 are formed in the quartz wafer in a matrix.

In the preparation of the cap member 19 of Step S1-3, the cap member 19 is manufactured in the form such that the piezoelectric device 1 can be assembled. The cap member 19 is formed by molding a plate material made of, for example, 42 alloy or kobar alloy, or a metal, such as phosphor bronze, through known sheet-metal processing in the related art, such that the cap member is formed in which the concave portion is formed in the central portion and the contact leg portion 19c is provided annularly in the peripheral portion.

Next, a manufacturing process from the manufacturing of the ceramic substrate 10 until the assembling of the piezoelectric device 1 will be described successively.

Method of Manufacturing Ceramic Substrate

In this embodiment, a ceramic green sheet is used as the base material of the ceramic substrate 10. In manufacturing the ceramic substrate 10, first, as shown in Step S1-2, a green sheet 51 (see FIG. 4) is prepared to have the size such that a plurality of ceramic substrates 10 can be formed to be arranged in a matrix, that is, in a matrix of m columns×n rows (where n and m are natural number equal to or greater than 2). In the green sheet 51 shown in FIGS. 4, 5, and 8A and 83, the forming region of the single ceramic substrate 10 is shown as a piezoelectric device forming region 1A.

In general, the green sheet 51 can be obtained by uniformly placing slurry containing ceramic powder on a film by a doctor blade method, drying the slurry, and cutting the dried slurry in a rectangular shape of a desired size. The material for the ceramic powder is not particularly limited, and alumina ($Al_2O_3$), aluminum nitride (AlN), or the like may be used which is excellent in characteristics, such as heat resistance, insulation resistance, abrasion resistance, and airtightness resistance, or electrical characteristics. In addition to the ceramic powder, an organic binder, a plasticizer, a solvent, and the like are added to the slurry. The green sheet 51 has comparatively high plasticity in a state of being uncalcinated.

Next, as shown in Step S2, in each piezoelectric device forming region 1A, through holes (also referred to as via holes) are formed so as to form in-layer wiring lines for supplying electricity necessary for providing electric conduction between both main surfaces of the ceramic substrate 10. The through holes are formed through, for example, hole-drilling, such as pressing or punching.

Next, as shown in Step S3, for example, conductor paste containing a high-melting-point metal, such as tungsten (W) or molybdenum (Mo), is filled in the through holes formed in the ceramic substrate 10 through screen printing or the like. The filling provides electric conduction to the via holes, such that in-layer wiring lines 17 are formed to electrically connect both main surfaces of the ceramic substrate 10.

Figure 4:
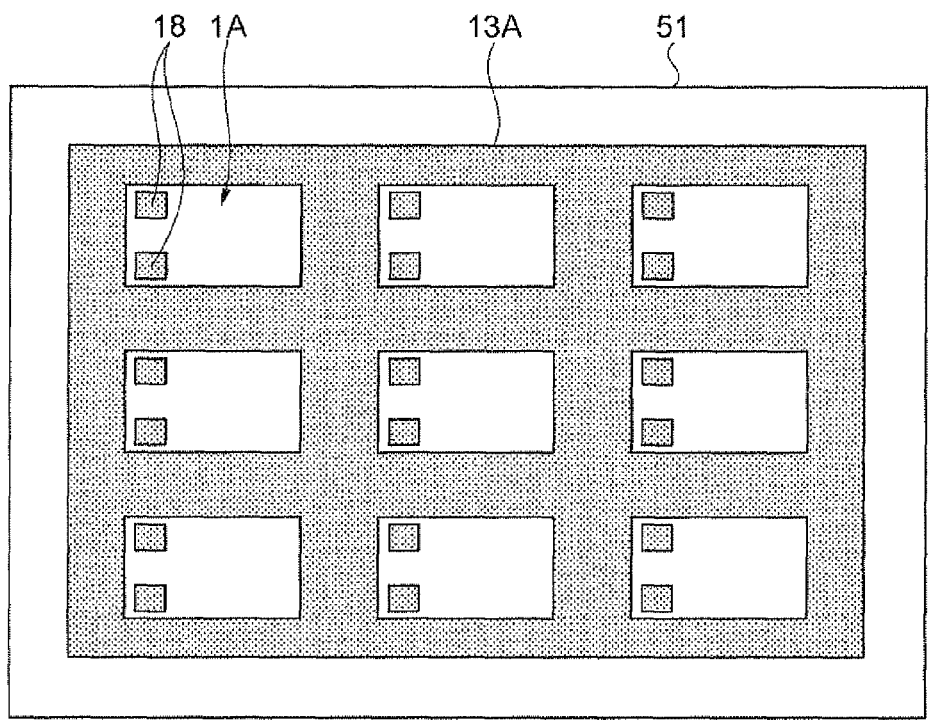
FIG. 4 is a schematic plan view showing a process for manufacturing a ceramic substrate of the first embodiment.

Subsequently, as shown in Step S4, for example, conductor paste containing a high-melting-point metal, such as tungsten or molybdenum, is screen-printed to form a conductor pattern as the base of the vibrating piece bonding terminals 18, the metal layer 13, or an inter-terminal wiring line or a plating conductor pattern. The plating conductor pattern indicates a plating wiring line for supplying a plating voltage through the inter-terminal wiring lines in forming a metal-plated film necessary for the vibrating piece bonding terminals 18 or the metal layer 13 through electrolytic plating at the time of conductor pattern plating of Step S7 described below. FIG. 4 shows a state where a conductor pattern as the base of the vibrating piece bonding terminals 18 is printed in a plurality of piezoelectric device forming regions 1A of the green sheet 51, and a conductor pattern 13A is formed as the original form of the metal layer 13 (the inter-terminal wiring line, the via holes, the plating conductor pattern, and the like are not shown).

The provision of electric conduction to the via holes of Step S3 and the conductor pattern printing of Step S4 may be performed simultaneously through screen printing.

Next, as shown in Step S5, a segmentation groove and the step portion 11 are provided in the green sheet 51 by pressing a pressing blade so as to be folded and cut off in segmenting a ceramic sheet 51A described below into the individual piezoelectric devices 1 (see FIGS. 5, 6A, and 6B). With regard to the segmentation groove (not shown), a deep concave segmentation groove is formed by more strongly pressing than the step portion 11 using a pressing blade with a smaller width than the step portion 11. The size and depth of the segmentation groove are to the extent such that the segmentation groove is not folded through normal handling, and the segmentation groove is in the form such that folding and cutting can be carried out reasonably.

Hereinafter, in the formation of the segmentation groove and the step portion 11, the formation of the step portion 11 will be described in detail.

Figure 6A:
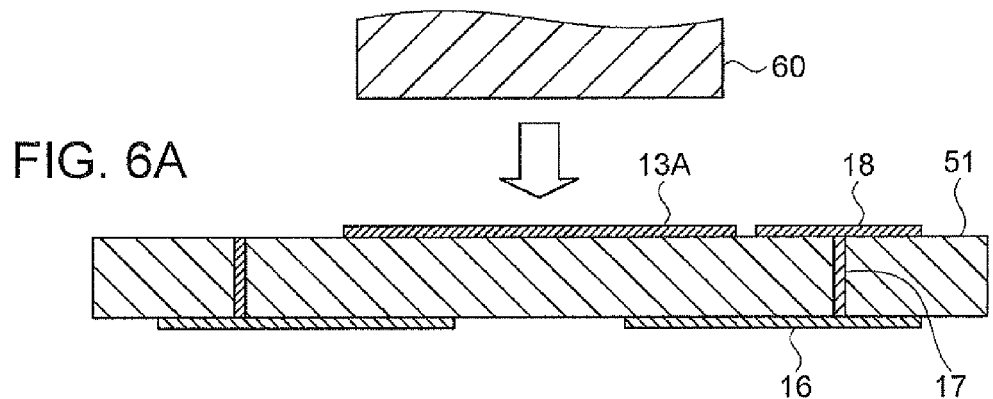
FIGS. 6A to 6D are partial enlarged sectional views showing a process for manufacturing a ceramic substrate of the first embodiment.

As shown in FIG. 6A, in the formation of the step portion 11, a pressing blade 60 which has both lateral surfaces perpendicular to a surface in initial contact with the green sheet 51 is pressed against the green sheet 51 at a predetermined pressure. The conductor pattern 13A as the original form of the metal layer 13 is formed on the contact surface.

Figure 6B:
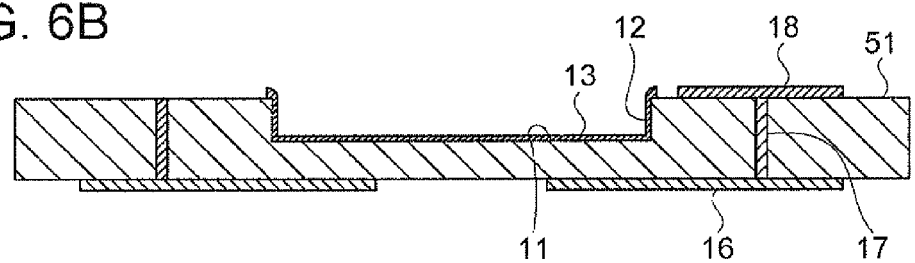

When this happens, as shown in FIG. 6B, the uncalcinated green sheet 51 having plasticity is plastically deformed, such that a concave portion is formed in the shape of the pressing blade 60. That is, the step portion 11 is formed to be substantially parallel to one main surface of the green sheet 51 on which the vibrating piece bonding terminals 18 are provided, and the wall surface 12 is formed to be perpendicular to the step portion 11. On the surface of the concave portion defined by the step portion 11 and the wall surface 12 formed by the pressing blade 60, the conductor pattern 13A is pressed and thinned by the pressing blade 60 to form the metal layer 13.

The positional relationship between the surfaces of the step portion 11 and the wall surface 12 provided perpendicularly to the step portion 11 is established to include the metal layer 13 formed on the surfaces.

Next, as shown in Step S6, the green sheet 51 in which the step portion 11 having the wall surface 12 is formed is calcinated at a high temperature in a reductive atmosphere. For example, when the ceramic powder of the green sheet 51 is alumina, the ceramic powder is calcinated at a temperature of about 1550° C. simultaneously with the high-melting-point metal of the conductor pattern.

Next, as shown in Step S7, the green sheet 51 (hereinafter, the calcinated green sheet 51 is referred to as a ceramic sheet 51A) which has been calcinated in Step S6 is dipped in an electrolytic plating solution, and electric conduction is provided through the plating conductor pattern to form an electrolytic plated film (not shown) on all of the exposed conductor patterns made of a high-melting-point metal, such as the vibrating piece bonding terminals 18 or the metal layer 13. The type of the electrolytic plated film is not particularly limited, and, for example, an electrolytic nickel-plated film, an electrolytic gold-plated film, or a multilayer electrolytic plated film with nickel and gold laminated in that order may be used.

Figure 5:
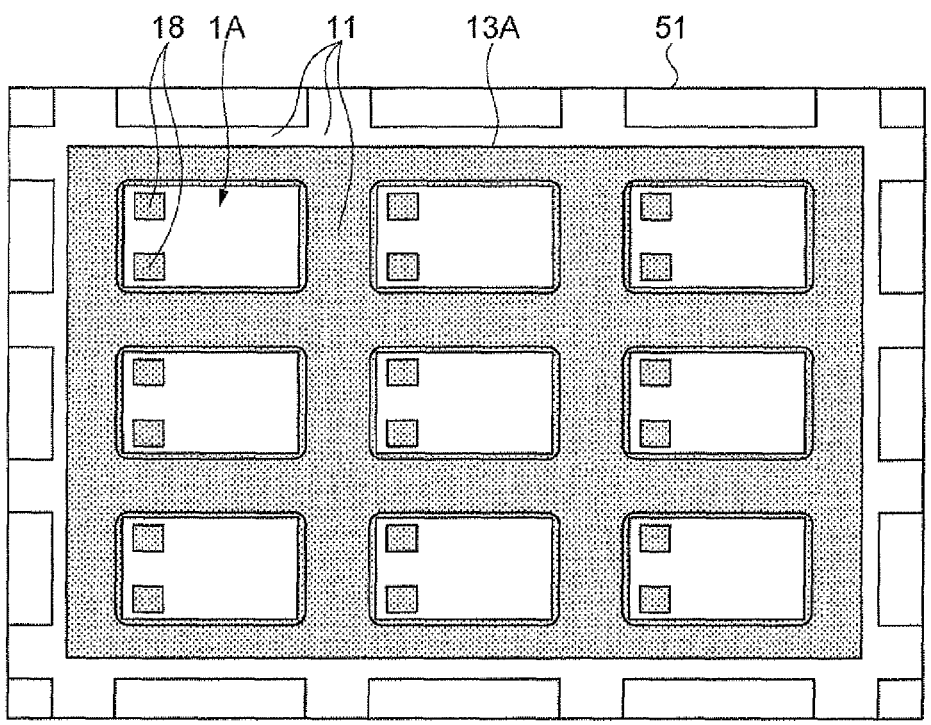
FIG. 5 is a schematic plan view showing process for manufacturing a ceramic substrate of the first embodiment.

As described above, through the preparation of the green sheet 51 of Step S1-2 and Steps S2 to S7, the ceramic sheet 51A is completed in which a plurality of ceramic substrates 10 each having the step portion 11 are formed in a matrix (see FIG. 5).

Figure 8A:
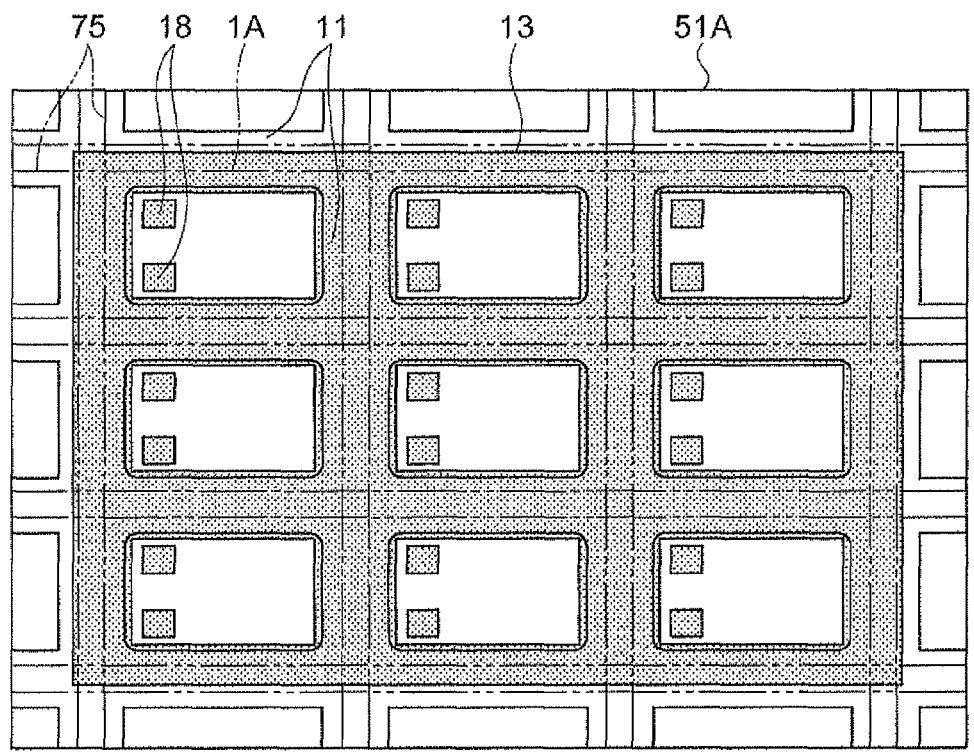
FIGS. 8A and 8B are schematic plan views showing a process for manufacturing a ceramic substrate of the first embodiment.
Figure 8B:
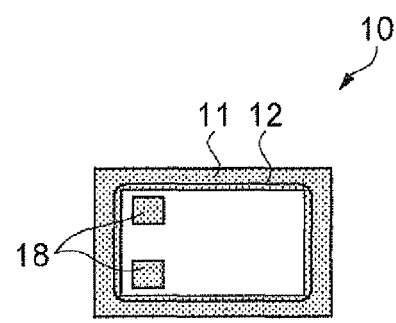

In this step, the ceramic sheet 51A may be segmented into the individual ceramic substrates 10. For example, as shown in FIG. 8A, the ceramic sheet 51A in which a plurality of piezoelectric device forming regions 1A are formed in a matrix is diced along a dicing line 75 indicated by a virtual line (two-dot-chain line) in the drawing, obtaining the individual ceramic substrate 10 shown in FIG. 8B.

Method of Assembling Piezoelectric Device 1

In this embodiment, a method which efficiently assembles the piezoelectric device 1 in a state of the ceramic sheet 51A with a plurality of ceramic substrates 10 formed will be described below.

In a piezoelectric device assembling process, first, as shown in Step S8 of FIG. 3, the piezoelectric vibrating piece 20 which has been prepared Step S1-1 is bonded to each piezoelectric device forming region 1A of the ceramic sheet 51A. Specifically, first, the bonding member 39, such as silver paste, is applied onto the vibrating piece bonding terminals 18 of each piezoelectric device forming region 1A through a dispenser or screen printing, and the external connection electrodes 26 provided at one end of the piezoelectric vibrating piece 20 are aligned correspondingly with the vibrating piece bonding terminals 18 and temporarily tacked. Then, processing is performed in accordance with a method of curing the bonding member 39. For example, in the case of the thermosetting bonding member 39, heating is performed at a predetermined temperature, and in the case of the UV curable bonding member, ultraviolet rays are irradiated, solidifying the bonding member 39 and bonding the piezoelectric vibrating piece 20 in the form of being supported in a cantilever manner.

Next, as shown in Step S9, the cap member 19 is arranged in each piezoelectric device forming region 1A of the ceramic sheet 51A to which the piezoelectric vibrating piece 20 is bonded. As shown in FIGS. 1A, 1B, and 2, the cap member 19 is guided along the wall surface and engaged with the convex portion defined by the wall surface 12 having substantially the same shape as the opening of the concave portion and the bonding surface of the piezoelectric vibrating piece 20, such that the cap member 19 can be easily positioned. At this time, the soldering material 29 is disposed between the metal layer 13 on the surfaces of the step portion 11 and the wall surface 12 and the sidewall portion 19b and the contact leg portion 19c of the cap member 19.

As the soldering material 29, a soldering material, for example, an alloy (eutectic alloy), such as as gold-nickel (Au—Ni), gold-tin (Au—Sn), or gold-germanium (Au—Ge), or a solder may be used. Low-melting-point glass, an adhesive which is used as a sealing material, or the like may be used. At this time, the soldering material 29 or a portion thereof may be provided on the metal layer 13 of the ceramic substrate 10 or in the contact portion of the cap member 19 for the ceramic substrate 10.

Next, as shown in Step S10, for example, the ceramic sheet 51A is put into a constant temperature furnace which is maintained at a temperature of 300° C. to 350° C. in a state where the cap member 19 is in contact with the step portion 11 and the wall surface 12 (metal layer 13) of the ceramic substrate 10 through the soldering material 29, and the soldering material 29 is heated until molten to bond the cap member 19 to the ceramic substrate 10. In this embodiment, the cap member 19 made of a metal is bonded with a metallic soldering material as the soldering material 29, making it possible to more rigidly and reliably seal the piezoelectric vibrating piece 20 airtight by the cap member 19.

It is preferable that a series of steps of bonding the cap member 19 to the ceramic substrate 10 (the arrangement of the cap member 19 in Step S9 and the bonding of the cap member 19 in Step S10) is performed in an inert gas atmosphere, such as nitrogen gas or argon gas, or in a reduced-pressure space. Thus, the cavity T defined by the ceramic substrate 10 and the cap member 19 in which the piezoelectric vibrating piece 20 is accommodated is filled with an inert gas or closed and sealed to a reduced-pressured space. Therefore, it is possible to effectively prevent corrosion and deterioration of the piezoelectric vibrating piece 20 due to oxygen, moisture in the air, or the like.

Through a series of steps described above, a plurality of piezoelectric devices 1 are formed in a matrix in the ceramic sheet 51A.

Figure 6C:
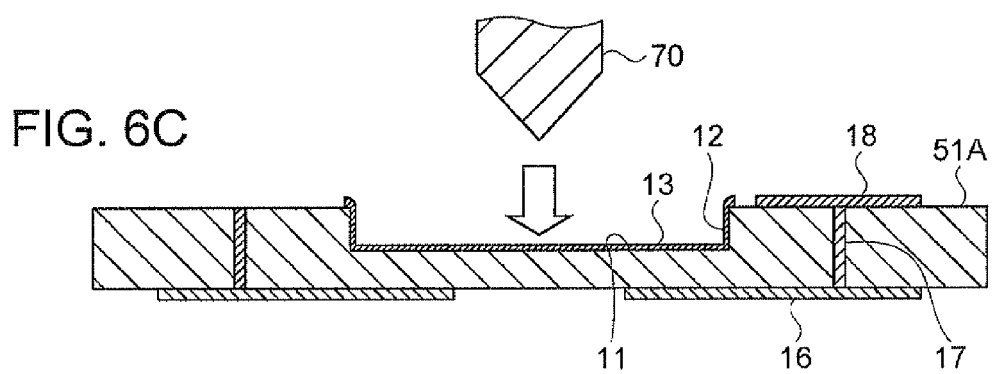
Figure 6D:
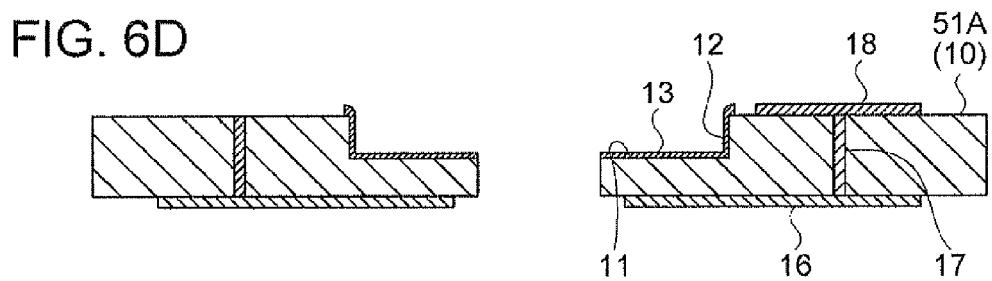

Next, as shown in Step S11, the ceramic sheet 51A which has passed through Step S10 is segmented to obtain a plurality of individual piezoelectric devices 1 simultaneously. The segmentation of the ceramic sheet 51A is carried out, for example, through dicing along the dicing line 75 shown in FIG. 8A with a high-speed rotating dicing blade 70 of a dicing saw shown in FIG. 6C, such that the ceramic sheet 51A can be cut as shown in FIG. 6D. In FIGS. 6C and 6D, the members, such as the cap member 19 and the piezoelectric vibrating piece 20, are not shown.

However, as shown in FIGS. 6C and 6D, when the metal layer 13 formed in the ceramic sheet 51A is across the dicing line 75, if the dicing blade 70 is not replaced in cutting the metal layer 13 and in cutting the ceramic base material of the ceramic sheet 51A, abnormality in shape quality, such as burrs or trims, occurs in the cut surface, or the dicing blade 70 may be deteriorated rapidly, degrading manufacturing efficiency.

Figure 7A:
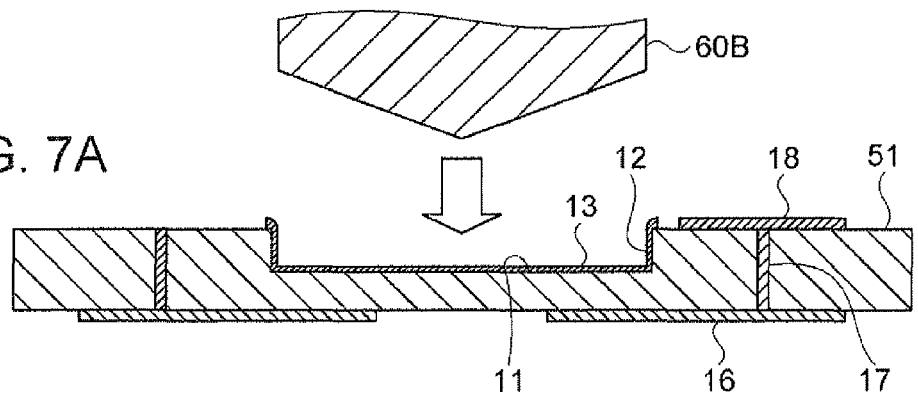
FIGS. 7A to 7D are partial enlarged sectional views showing a process for manufacturing a ceramic substrate of the first embodiment.
Figure 7B:
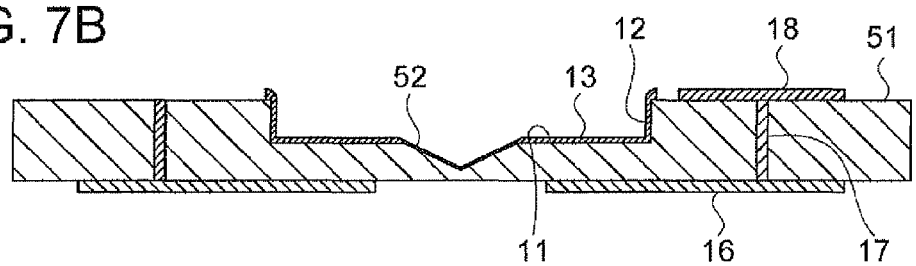

As a method of avoiding such problems, after the segmentation groove and the step portion 11 are formed in the segmentation groove/step portion formation step of Step S5, as shown in FIGS. 7A and 7B, an indentation 52 is formed on the dicing line of the step portion 11 using a pressing blade 608 having a pyramidal section. At this time, it is preferable that the width of the indentation 52 is the same as or slightly greater than the width of the dicing blade 70.

Figure 7C:
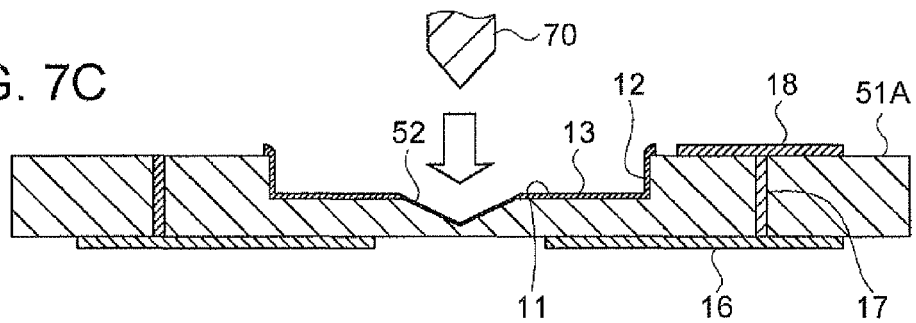
Figure 7D:
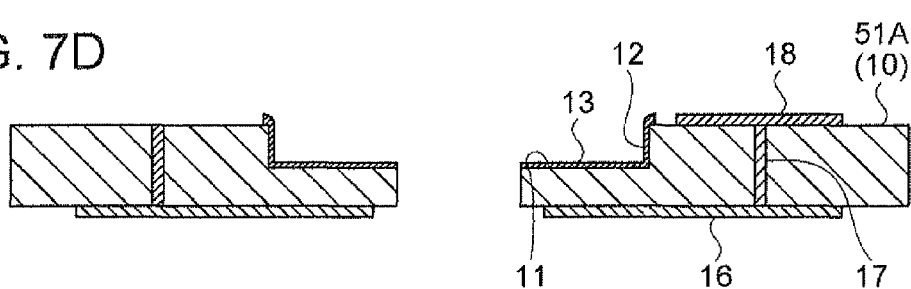

Thus, the metal film in the portion where the indentation 52 is formed is further pressed and significantly thinned. For this reason, as shown in FIG. 7C, dicing is carried out using the dicing blade 70 which is suitable for dicing the base material of the ceramic sheet 51A, segmenting the ceramic sheet 51A, in which a plurality of piezoelectric devices 1 are formed, with a satisfactory cut surface, as shown in FIG. 7D. In FIGS. 7C and 7D, the members, such as the cap member 19 and the piezoelectric vibrating piece 20, are not shown.

Figure 9A:
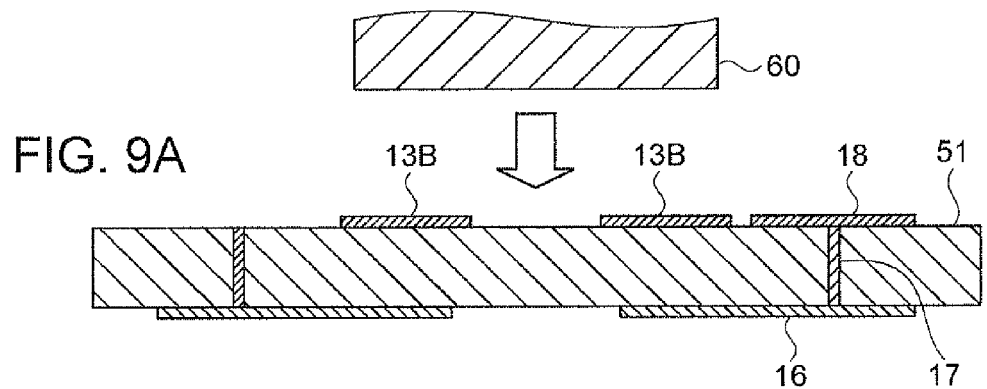
FIGS. 9A to 9D are partial enlarged sectional views showing a process for manufacturing a ceramic substrate of the first embodiment.
Figure 9B:
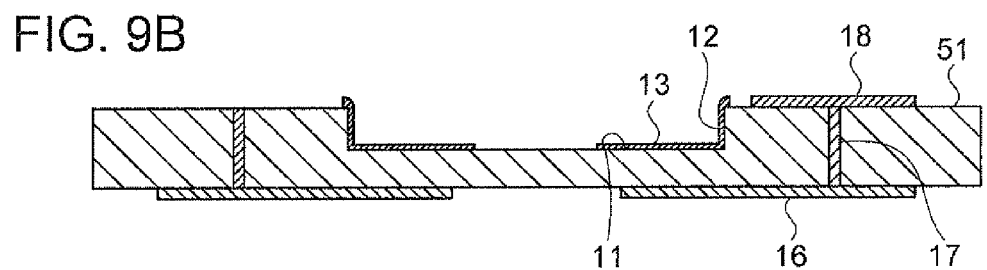

As a method of carrying out better dicing, in the conductor pattern printing step of Step S4, as shown in FIG. 9A, a conductor pattern 13B as the original form of the metal layer 13 is formed in a region other than the region where the dicing line of the green sheet 51 is formed. In other words, it is preferable that the distance between the conductor pattern 13B and the conductor pattern 13B is the same as or slightly greater than the width of the dicing blade 70. When this happens, as shown in FIG. 9B, there is no case where the metal layer 13 is across the dicing line. Therefore, it is not necessary to cut the metal layer 13.

Figure 9C:
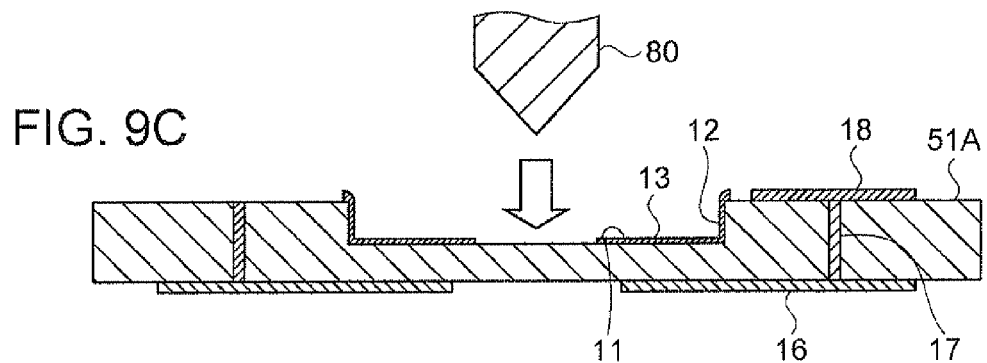
Figure 9D:
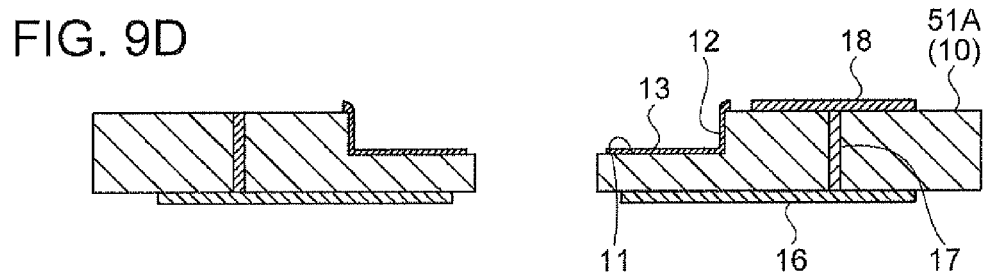

Thus, as shown in FIG. 9C, dicing is carried out using a dicing blade 80 which is suitable for dicing the base material of the ceramic sheet 51A, segmenting the ceramic sheet 51A into the piezoelectric devices (1) with a more satisfactory cur surface, as shown in FIG. 9D. In FIGS. 9C and 9D, the members, such as the cap member 19 and the piezoelectric vibrating piece 20, are not shown.

The piezoelectric device 1 obtained through the segmentation in Step S11 is completed after being subjected to inspection of electrical characteristics or appearance quality, as shown in Step S12, and a series of manufacturing process of the piezoelectric device 1 ends.

According to the piezoelectric device 1 of the above-described embodiment and the manufacturing method thereof, the contact surface of the cap member 19 is bonded to the contact surfaces of the step portion 11 and the wall surface 12 formed in the edge portion on the main surface (the other main surface) on which the vibrating piece bonding terminals 18, to which the piezoelectric vibrating piece 20 of the ceramic substrate is bonded, are provided. Thus, the bonding area of the ceramic substrate 10 and the cap member 19 increases, carrying out rigid bonding, compared to the known structure in which the cap member is bonded to the flat surface of the ceramic substrate. Therefore, it is possible to seal the piezoelectric vibrating piece 20 with high airtightness.

In the above-described embodiment, the uncalcinated green sheet 51 having flexibility is used as the material for the ceramic substrate 10, and the process sequence is determined such that calcination is performed after the step portion 11 is formed in the segmentation groove formation step using a segmentation blade as the standard step in the manufacturing process of the ceramic substrate 10 using the green sheet 51.

Therefore, it is possible to comparatively easily form the step portion 11 and the wall surface 12 of the step portion 11 using the existing instrument while suppressing an increase in the number of manufacturing steps.

In the piezoelectric device 1 of the above-described embodiment, the shape of the step portion 11 in the edge portion of the ceramic substrate 10 is substantially the same as the shape of the opening of the cap member 19 in plan view.

Thus, the cap member 19 is guided along the wall surface 12 and engaged with the convex portion defined by the wall surface 12 of the step portion 11 and the bonding surface of the piezoelectric vibrating piece 20, such that the cap member 19 can be placed on the ceramic substrate 10. Therefore, it is possible to easily position the cap member 19 without causing misalignment.

Modification 1 of First Embodiment

Although in the first embodiment, on the wall surface 12 of the ceramic substrate 10, the metal layer has been formed from the step portion 11 to the bonding surface of the piezoelectric vibrating piece 20, the invention is not limited thereto. The metal layer 13 of the wall surface 12 may be formed at a predetermined interval from the bonding surface of the piezoelectric vibrating piece 20, making it possible to avoid a problem which may occur in bonding the cap member 19.

Figure 11:
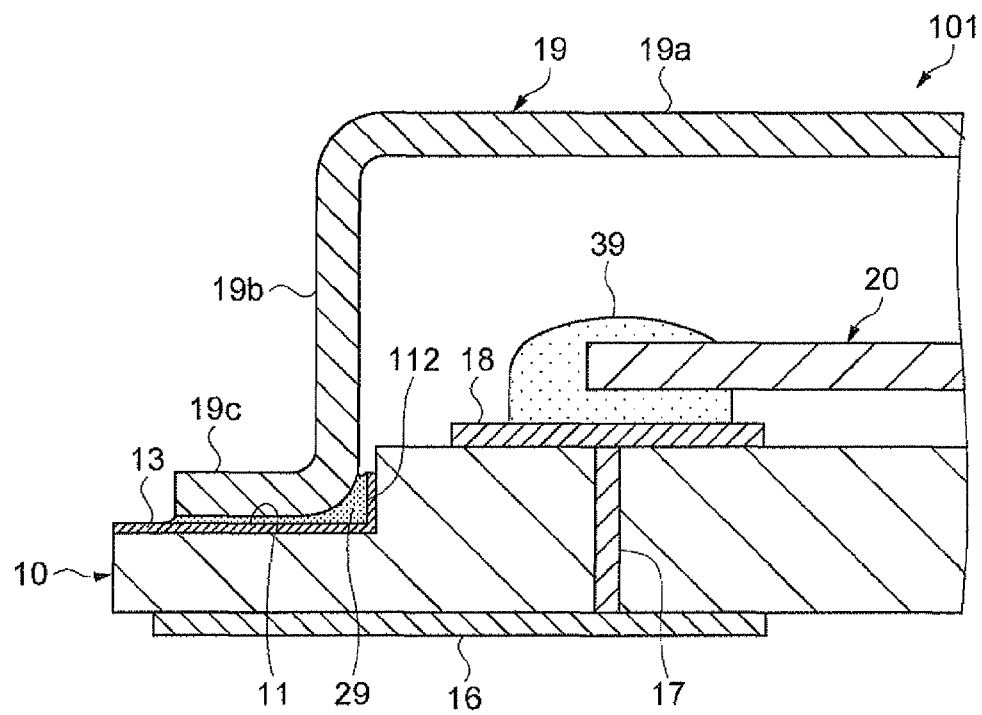
FIG. 11 is a partial sectional view illustrating Modification 1 of the first embodiment.

FIG. 11 shows Modification 1 of the first embodiment of the piezoelectric device in which the forming position of the metal layer of the wall surface is defined. FIG. 11 is a partial sectional view illustrating the same section as in FIG. 2 on a magnified scale. In this example, the same parts as those in the piezoelectric device 1 of the above-described embodiment are represented by the same reference numerals, and description thereof will be omitted.

Referring to FIG. 11, a ceramic substrate 10 of a piezoelectric device 101 is configured such that, in the edge portion of the bonding surface of a piezoelectric vibrating piece 20 on which vibration pieces bonding terminals 18 are provided, a step portion 11 is formed to be substantially parallel to the bonding surface of the piezoelectric vibrating piece 20. A wall surface 112 having a step defined by the step portion 11 and the bonding surface of the piezoelectric vibrating piece 20 is provided perpendicularly to the step portion 11.

A metal layer 13 is provided on the surface of the step portion 11 and on the wall surface 112. Of these, the metal layer 13 of the wall surface 112 is provided at an interval from the bonding position of the piezoelectric vibrating piece 20.

With the configuration of Modification 1 of the first embodiment, no metal layer 13 is provided on the wall surface 112 near the bonding surface of the piezoelectric vibrating piece 20. Therefore, when a cap member 19 is bonded to the ceramic substrate 10, to which the piezoelectric vibrating piece 20 is bonded, through soldering, it is possible to suppress degradation of the function of the piezoelectric vibrating piece 20 due to flying of molten droplets of the soldering material 29 made of a metal or alloy toward the piezoelectric vibrating piece 20.

Modification 2 of First Embodiment

Although in the first embodiment or Modification 1, a case has been described where the sectional shape of the connection portion of the step portion 11 and the wall surface 12 or 112 of the ceramic substrate 10 is an angular shape substantially at right angles, the invention is not limited thereto. The shape from the step portion to the wall surface may conform to the shape of the cap member from the sidewall portion to the contact leg portion, improving bonding strength of the cap member 19 to the ceramic substrate 10.

Figure 12:
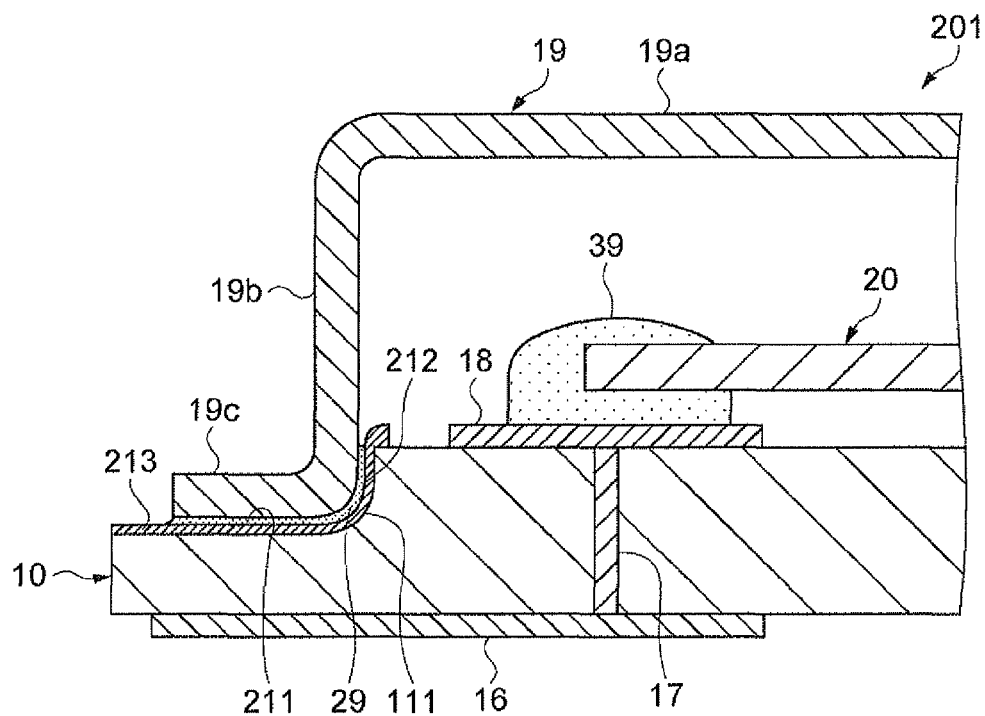
FIG. 12 is a partial sectional view illustrating Modification 2 of the first embodiment.

FIG. 12 shows Modification 2 of the first embodiment of the piezoelectric device in which the shape from the step portion to the wall surface is changed. FIG. 12 is a partial sectional view illustrating the same section as in FIG. 2 (and FIG. 11) on a magnified scale. In this example, the same parts as those in the piezoelectric device 1 of the above-described embodiment are represented by the same reference numerals, and description thereof will be omitted.

Referring to FIG. 12, a ceramic substrate 10 of a piezoelectric device 201 is configured such that, in the edge portion of the bonding surface of a piezoelectric vibrating piece 20 on which vibrating piece bonding terminals 18 are provided, a step portion 211 formed to be substantially parallel to the bonding surface of the piezoelectric vibrating piece 20, and a wall surface 212 is formed to have a step defined by the step portion 211 and the bonding surface of the piezoelectric vibrating piece 20. The wall surface 212 is provided perpendicularly to the step portion 211. A connection portion 111 of the step portion 211 and the wall surface 212 has an arc-shaped (rounded) sectional shape without being angulated. The arc-shaped sectional shape of the connection portion 111 is substantially the same arc shape as a connection portion of a sidewall portion 19b and a contact leg portion 19c of a cap member which are in contact with and bonded to the step portion 211 and the wall surface 212. The arc-shaped connection portion 111 can be shaped through pressing using a pressing blade which has a shape capable of forming the step portion 211 and the wall surface 212 connected to each other by the arc-shaped connection portion 111 in the step of forming the step portion 211 (the segmentation groove/step portion formation step shown in Step S5 of FIG. 3).

Like the above-described embodiment, in an electronic apparatus (piezoelectric device 1) in which a substrate (ceramic substrate 10) with an electronic component (piezoelectric vibrating piece 20) bonded is sealed airtight with the cap member 19, there are many cases where the cap member 19 is formed through known sheet-metal processing using a metal material. In this case, the connection portion which connects the sidewall portion 19b and the contact leg portion 19c of the cap member 19 perpendicularly is bent to have an arc-shaped sectional shape (rounded sectional shape).

With the piezoelectric device 201 according to Modification 2 of the first embodiment, the sectional shape of the connection portion 111 which connects the step portion 211 and the wall surface 212 approximates the sectional shape of the connection portion having an arc-shaped sectional shape which connects the sidewall portion 19b and the contact leg portion 19c of the cap member 19. Thus, in the bonding of the cap member 19 and the ceramic substrate 10, the contact portions or adjacent portions increase, making it easy to obtain a satisfactory bonding state. Therefore, it is possible to provide the piezoelectric device 201 which is sealed with high airtightness and has high operation stability.

Second Embodiment

Next, as a second embodiment, a configuration in which a wall surface of a step portion is provided to be inclined from the step portion to an electronic component bonding region will be described with reference to FIGS. 13A to 17. In the description of the second embodiment, the same parts as those in the piezoelectric device of the first embodiment are represented by the same reference numerals, and description thereof will be omitted.

Piezoelectric Device

Figure 13A:
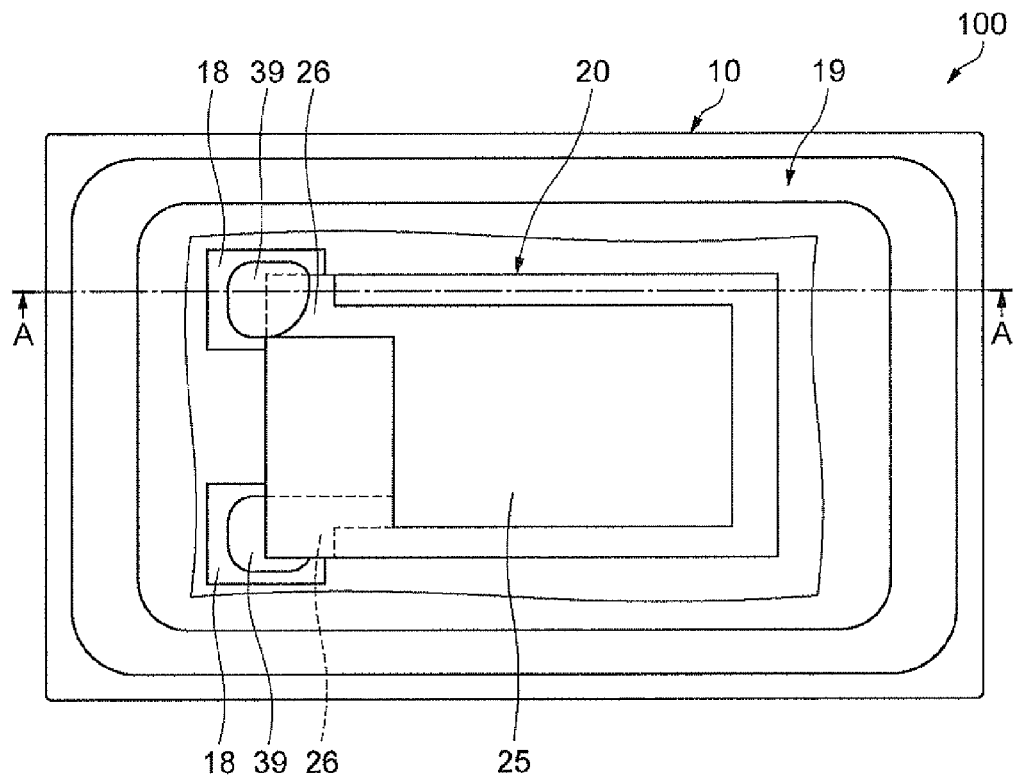
FIGS. 13A and 13B show a second embodiment of a piezoelectric device as an electronic apparatus, and specifically.
Figure 13B:
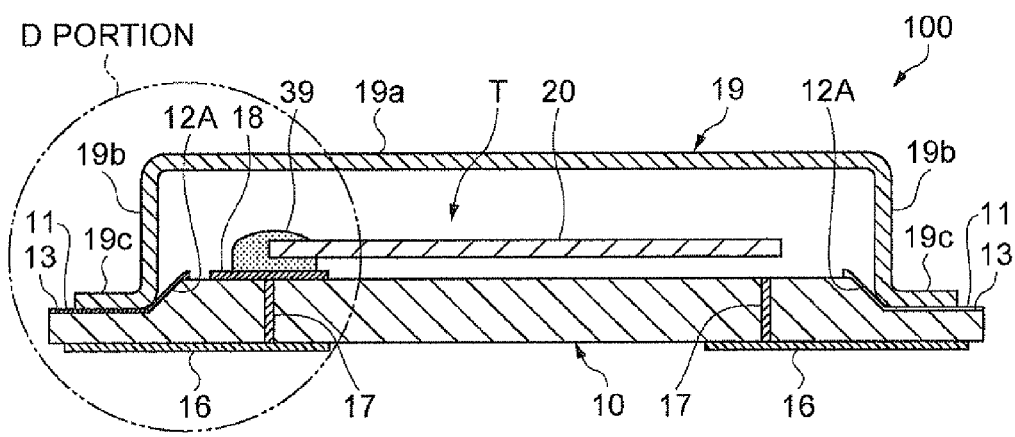
Figure 14:
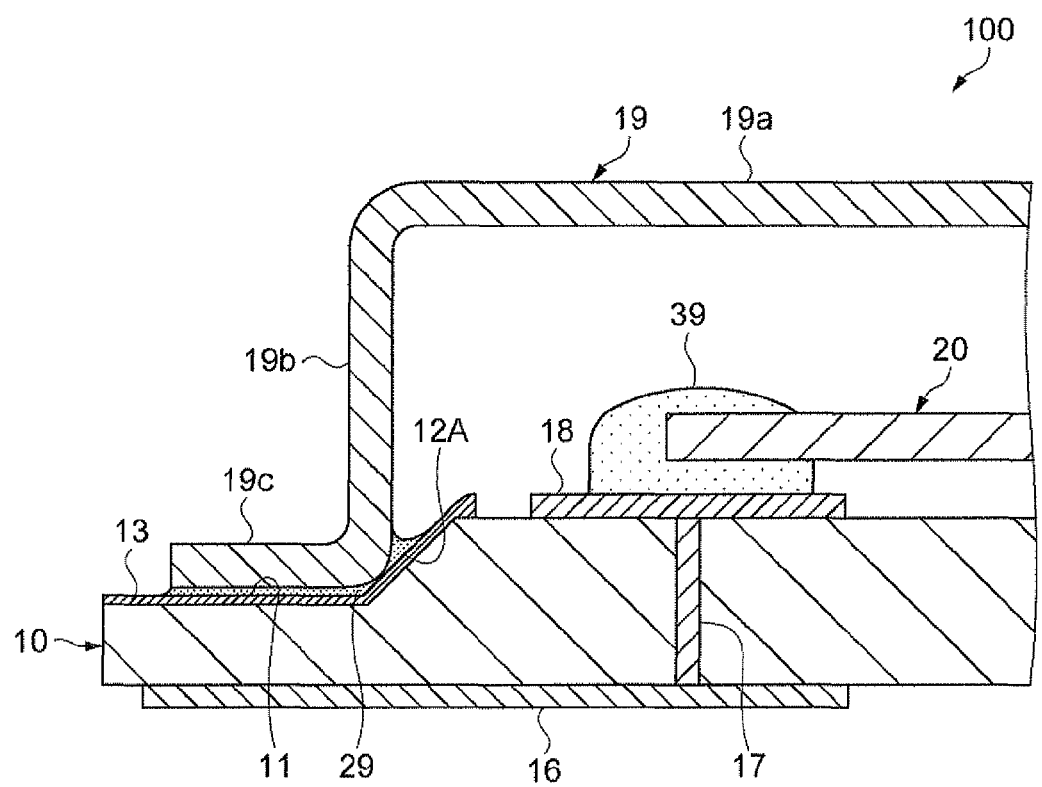
FIG. 14 is a partial sectional view specifically illustrating a D portion of FIG. 13B on a magnified scale.

FIGS. 13A and 13B illustrate the second embodiment of the piezoelectric device as an electronic apparatus. FIG. 13A is a schematic plan view when viewed from above and FIG. 13B is a schematic sectional view taken along the line A-A of FIG. 13A. For convenience in describing the internal structure of the piezoelectric device, a cap member 19 provided above the piezoelectric device is shown as partially cut away in FIG. 13A. FIG. 14 is a partial sectional view illustrating a D portion of FIG. 13B on a magnified scale.

Referring to FIGS. 13A and 13b, a piezoelectric device 100 has a ceramic substrate 10 as a substrate, a piezoelectric vibrating piece 20 as an electronic component bonded to the ceramic substrate 10, a concave cap member 19 boned to the ceramic substrate 10 so as to cover the piezoelectric vibrating piece 20. The piezoelectric vibrating piece 20 is sealed airtight in a cavity T defined by the ceramic substrate 10 and the cap member 19.

The ceramic substrate 10 has a plurality of external mounting terminals 16 on one main surface of a flat plate-shaped insulating base material and vibrating piece bonding terminals 18, to which the piezoelectric vibrating piece 20 is bonded, on the other main surface. The vibrating piece bonding terminals 18 and other terminals (not shown) are correspondingly connected to the external mounting terminals 16 through in-layer wiring lines (vias) 17 formed by burying conductor paste containing a high-melting-point metal in through holes (via holes) provided in the ceramic substrate 10.

The one main surface of the ceramic substrate 10 on which the external mounting terminals 16 are provided becomes the outer bottom surface of the piezoelectric device 100. With the external mounting terminals 16 provided on the outer bottom surface, the piezoelectric device 100 can be mounted on an external mounting substrate of an electronic apparatus or the like. The ceramic substrate 10 of this embodiment is formed by molding and machining a green sheet for a ceramic substrate and performing calcination. This is the same as in the first embodiment, and description thereof will be omitted.

In the edge portion of the surface (the other main surface) of the vibrating piece bonding region as an electronic component bonding region on which the vibrating piece bonding terminals 18 of the ceramic substrate 10 are provided, a step portion 11 is formed which is substantially parallel to the other main surface, surrounds the vibrating piece bonding region, and has a surface lower than the surface of the vibrating piece bonding region. In other words, the surface of the step portion 11 on the other main surface is formed with a decreasing (thinning) thickness based on the one main surface of the insulating base material compared to the surface of the main surface of the vibrating piece bonding region. A wall surface 12A having a step defined by the step portion 11 and the vibrating piece bonding region is provided to be inclined from the step portion toward the surface of the vibrating piece bonding region.

An annular metal layer 13 is provided on the step portion 11 and the wall surface 12A so as to surround the vibrating piece bonding region.

The piezoelectric vibrating piece 20, the connection of the piezoelectric vibrating piece 20, and the cap member 19 are the same as those in the first embodiment, thus description thereof will be omitted.

In the piezoelectric device 100 of this embodiment, as described above, in the edge portion of the surface of the vibrating piece bonding region of the ceramic substrate 10, the step portion 11 is formed which is connected to the wall surface 12A provided to be inclined on the surface of the vibrating piece bonding region. Thus, the cap member 19 is guided along the wall surface 12A and engaged with the convex portion defined by the wall surface 12A and the bonding surface of the piezoelectric vibrating piece 20, such that the cap member 19 can be easily positioned. Therefore, even when a manufacturing variation occurs in the opening shape of the cap member 19, it is possible to prevent misalignment of the cap member 19 and thus to avoid a problem, such as defective appearance since the cap member protrudes from the periphery of the piezoelectric device 100 and the dimension standard of the planar contour is not satisfied, or degradation of bonding strength or sealing airtightness of the cap member 19.

With the piezoelectric device 100 of this embodiment using the ceramic substrate 10 with the step portion 11 provided in the edge portion, the contact leg portion 19c of the cap member 19 is bonded to the step portion 11 of the ceramic substrate 10, and the vicinity of the boundary portion between the wall surface 12A and the step portion 11 is also bonded to the sidewall portion 19b, compared to the known ceramic substrate in which the cap member is bonded to the flat surface. Therefore, it is possible to improve bonding strength of the cap member 19 to the ceramic substrate 10 and to reliably seal the piezoelectric vibrating piece 20 airtight.

It is preferable that the cap member 19 is electrically connected to the ground terminal (not shown) of the ceramic substrate 10 through the metal layer 13 provided on the step portion 11 and the wall surface 12A. When this happens, at the time of using the piezoelectric device 100, the cap member 19 made of a metal is maintained at the ground potential, such that the piezoelectric vibrating piece 20 can be protected from unnecessary electrical actions from the outside, for example, noise because of the shield effect of the cap member 19.

In the above-described piezoelectric device 100, a swing voltage from the outside is applied between the excitation electrodes 25 provided on both main surfaces of the piezoelectric vibrating piece 20 through the external mounting terminals 16 provided on the bottom surface of the ceramic substrate 10. Thus, vibration is generated at a predetermined frequency in accordance with the characteristics of the piezoelectric vibrating piece 20. The piezoelectric device 100 can oscillate and output a reference signal at a predetermined frequency on the basis of the resonance frequency of the piezoelectric device 100 by an external oscillation circuit. The reference signal can be used as a clock signal in an electronic apparatus, such as a portable communication instrument.

Method of Manufacturing Piezoelectric Device

Figure 16:
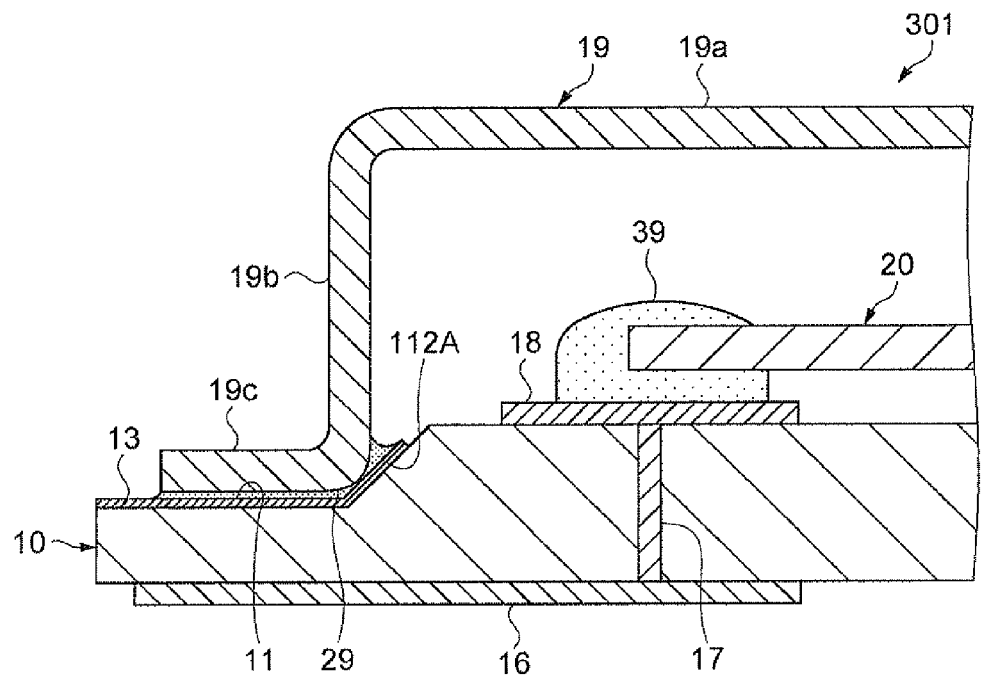
FIG. 16 is a partial sectional view illustrating Modification 3 of the second embodiment.

Next, a method of manufacturing the piezoelectric device 100 configured as above will be described with reference to the drawings particularly focusing on a method of manufacturing the ceramic substrate 10. Here, description of the same steps as in the first embodiment will be omitted, and different steps will be described with reference to FIG. 3 which is used in describing the first embodiment. FIG. 16 is a partial sectional view illustrating the same section as in FIG. 14 on a magnified scale.

While the manufacturing process of the piezoelectric device 100 is performed in accordance with the flowchart of FIG. 3, the segmentation groove/step portion formation step of Step S5 is different. Thus, Step S5 will be described, and description of other steps will be omitted.

The formation of the segmentation groove and the step portion 11 in Step S5 will be described with reference to FIGS. 15A and 15B. In the formation of the step portion 11, as shown in FIG. 15A, a pressing blade has inclined surfaces 61 which are inclined at a predetermined angle with respect to a surface in initial contact with the green sheet 51 toward both lateral surfaces 62, and the inclined surfaces 61 are connected to both lateral surfaces 62. The pressing blade 60 is pressed against the green sheet 51 at a predetermined pressure. When this happens, as shown in FIG. 15B, the uncalcinated green sheet 51 having plasticity is plastically deformed, such that a concave portion is formed substantially in the same shape as the pressing blade 60. That is, the step portion 11 is formed to be substantially parallel to the surface of the vibrating piece bonding region of the green sheet 51 on which the vibrating piece bonding terminals 18 are provided, and the wall surface 12A is formed to be inclined from the step portion 11 toward the surface of the vibrating piece bonding region.

As such, the formation of the step portion 11 having the wall surface 12A which is inclined to the surface of the vibrating piece bonding region can be performed by only using the pressing blade 60 for forming the step portion 11 in the segmentation groove formation step through pressing in the manufacturing process of the ceramic substrate according to the related art, without providing a new process or instrument.

With the method of manufacturing the piezoelectric device 100 according to the second embodiment, in the edge portion of the surface of the vibrating piece bonding region of the ceramic substrate 10, the step portion 11 is formed which is connected to the wall surface 12A provided to be inclined to the surface of the vibrating piece bonding region. Thus, the cap member 19 is guided along the wall surface 12A and engaged with the convex portion defined by the wall surface 12A and the bonding surface of the piezoelectric vibrating piece 20, such that the cap member 19 can be easily positioned. Therefore, even when a manufacturing variation occurs in the opening shape of the cap member 19, it is possible to prevent misalignment of the cap member 19 and thus to avoid a problem, such as defective appearance since the cap member protrudes from the periphery of the piezoelectric device 100 and the dimension standard of the planar contour is not satisfied, or degradation of bonding strength or sealing airtightness of the cap member 19.

With the piezoelectric device 100 of this embodiment using the ceramic substrate 10 with the step portion 11 in the edge portion, the contact leg portion 19c of the cap member 19 is bonded to the step portion 11 of the ceramic substrate 10, and the vicinity of the boundary portion between the wall surface 12A and the step portion 11 is also bonded to the sidewall portion 19b, compared to the known ceramic substrate in which the cap member is bonded to the flat surface. Therefore, it is possible to improve bonding strength of the cap member 19 to the ceramic substrate 10 and to reliably seal the piezoelectric vibrating piece 20 airtight.

In the second embodiment, the uncalcinated green sheet 51 having plasticity is used as the material for the ceramic substrate 10, and the process sequence is determined such that calcination is performed after the step portion 11 is formed in the segmentation groove formation step using the pressing blade 60 as the standard step in the manufacturing process of the ceramic substrate using the green sheet.

Therefore, it is possible to comparatively easily form the step portion 11 and the wall surface 12A of the step portion 11 using the existing instrument while suppressing an increase in the number of steps from the manufacturing process of the related art.

The piezoelectric device and the manufacturing method thereof described in the second embodiment may be carried out as the following modifications.

Modification 3 of Second Embodiment

Although in the second embodiment, on the wall surface 12A of the ceramic substrate 10, the metal layer is formed from the step portion 11 to the bonding surface of the piezoelectric vibrating piece 20, the invention is not limited thereto. The metal layer of the wall surface may be formed at a predetermined interval from the bonding surface of the piezoelectric vibrating piece 20, making it possible to avoid a problem which may occur in bonding the cap member 19.

FIG. 16 shows Modification 3 of the second embodiment of the piezoelectric device in which the forming position of the metal layer of the wall surface is defined. FIG. 16 is a partial section view illustrating the same section as in FIG. 14 on a magnified scale. In this example, the same parts as those in the piezoelectric device 100 of the second embodiment are represented by the same reference numerals, and description thereof will be omitted.

Referring to FIG. 16, a ceramic substrate 10 of a piezoelectric device 301 is configured such that, in the edge portion of the bonding surface of a piezoelectric vibrating piece 20 on which vibrating piece bonding terminals 18 are provided, a step portion 11 is formed to be substantially parallel to the surface of a vibrating piece bonding region. A wall surface 112A which connects the step portion 11 and the surface of the vibrating piece bonding region is provided to be inclined from the step portion 11 toward the surface of the vibrating piece bonding region.

A metal layer 13 is provided on the surface of the step portion 11 and on the wall surface 112A. Of these, the metal layer 13 of the wall surface 112A is provided at an interval from the surface of the vibrating piece bonding region.

With the configuration of Modification 3 of the second embodiment, no metal layer 13 is provided on the wall surface 112A near the bonding surface of the piezoelectric vibrating piece 20. Therefore, when the cap member 19 is bonded to the ceramic substrate 10, to which the piezoelectric vibrating piece 20 is bonded, through soldering, it is possible to suppress degradation in the vibration characteristics of the piezoelectric vibrating piece 20 due to flying of molten droplets of a soldering material 29 made of a metal or alloy toward the excitation electrodes 25 of the piezoelectric vibrating piece 20 or the like.

Modification 4 of Second Embodiment

Although in the second embodiment and Modification 3, a case has been described where the sectional shape of the connection portion of the step portion 11 of the ceramic substrate 10 and the inclined wall surface 12A or 112A is an angular shape, the invention is not limited thereto. The shape from the step portion to the wall surface may be an arc shape to conform to the shape from the sidewall portion to the contact leg portion of the cap member, improving mechanical strength of the piezoelectric device or bonding strength of the cap member to the ceramic substrate.

Figure 17:
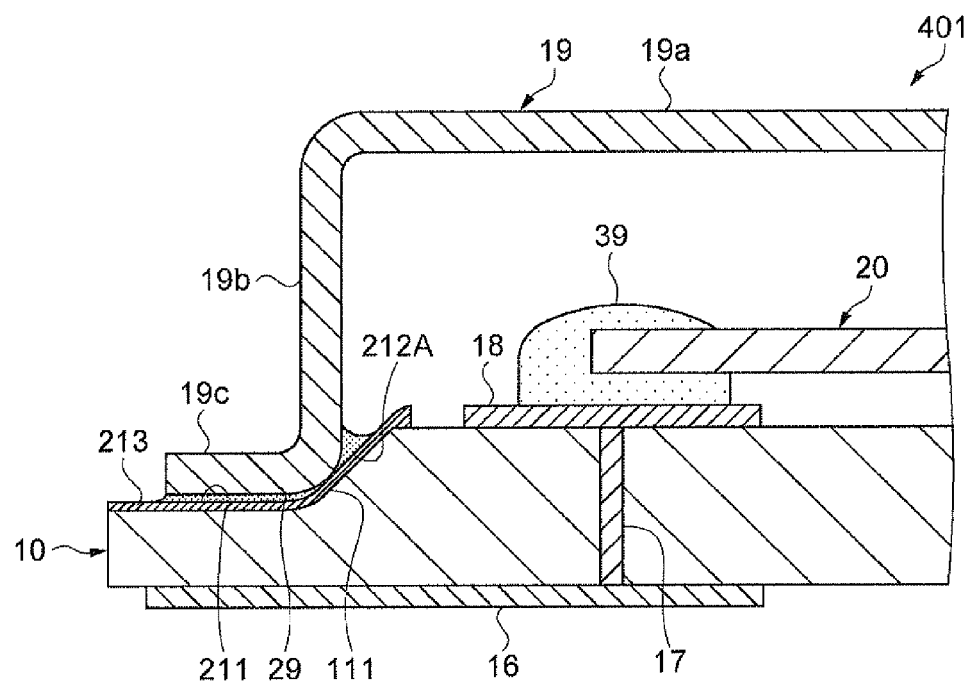
FIG. 17 is a partial sectional view illustrating Modification 4 of the second embodiment.

FIG. 17 shows Modification 4 of the second embodiment of the piezoelectric device in which the shape from the step portion to the wall surface is changed. FIG. 17 is a partial sectional view illustrating the same section as in FIG. 14 (and FIG. 16) on a magnified scale. In this example, the same parts as those in the piezoelectric device 100 of the second embodiment are represented by the same reference numerals, and description thereof will be omitted.

Referring to FIG. 17, a ceramic substrate 10 of a piezoelectric device 401 is configured such that, in the edge portion of the bonding surface of a piezoelectric vibrating piece 20 on which vibrating piece bonding terminals 18 are provided, a step portion 211 is formed to be substantially parallel to the surface of a vibrating piece bonding region. A wall surface 212A which connects the step portion 211 and the surface of the vibrating piece bonding region is provided to be inclined from the step portion 211 toward the surface of the vibrating piece bonding region.

A connection portion 111 of the step portion 211 and the wall surface 212A has an arc-shaped sectional shape without being angulated. It is preferable that the arc-shaped sectional shape of the connection portion 111 is substantially the same arc shape as a connection portion of a sidewall portion 19b and a contact leg portion 19c of a cap member 19 which are in contact with and bonded to the step portion 211 and the wall surface 212A. The arc-shaped connection portion 111 can be shaped through pressing using a pressing blade which has a shape capable of forming the step portion 211 and the wall surface 212 connected to each other by the arc-shaped connection portion 111 in the step of forming the step portion 211 (the segmentation groove/step portion forming step shown in Step 5 of FIG. 3).

Like the second embodiment, in an electronic apparatus (piezoelectric device 100) in which a substrate (ceramic substrate 10) with an electronic component (piezoelectric vibrating piece 20) bonded is sealed airtight with the cap member 19, there are many cases where the cap member 19 is formed through known sheet-metal processing using a metal material. In this case, the connection portion which connects the sidewall portion 19b and the contact leg portion 19c of the cap member 19 perpendicularly is bent to have an arc-shaped sectional shape.

With the piezoelectric device 401 of Modification 4 according to the second embodiment, the sectional shape of the connection portion 111 which connects the step portion 211 and the wall surface 212A approximates the sectional shape of the arc-shaped connection portion which connects the sidewall portion 19b and the contact leg portion 19c of the cap member 19. Therefore, it is possible to suppress occurrence of cracking when stress occurs in the connection portion of the step portion 211 and the wall surface 212A as the base point at which the ceramic substrate 10 is thinned, improving mechanical strength of the piezoelectric device 401.

In the bonding of the cap member 19 and the ceramic substrate 10, the contact portions or adjacent portions increase, making it easy to obtain a satisfactory bonding state. Therefore, it is possible to provide the piezoelectric device 401 which is sealed with high airtightness and has high operation stability.

The piezoelectric device and the manufacturing method thereof described in the above-described embodiment may be carried out as a third embodiment described below.

Third Embodiment

Although in the method of manufacturing the piezoelectric devices 1, 100, 101, 201, 301, and 401 of the above-described embodiments, the method has been described in which rectangular step portions 11 (see FIG. 5) with arc-shaped (rounded) corner portions in plan view are collectively formed in a plurality of piezoelectric device forming regions 1A of the green sheet 51 using the pressing blade 60 (see FIGS. 6A to 6D, 7A to 7D, 9A to 9D, and 15A and 15B), the invention is not limited thereto. A plurality of types of pressing blades may be used to form the shape of the step portion 11 in multiple times.

Figure 18:
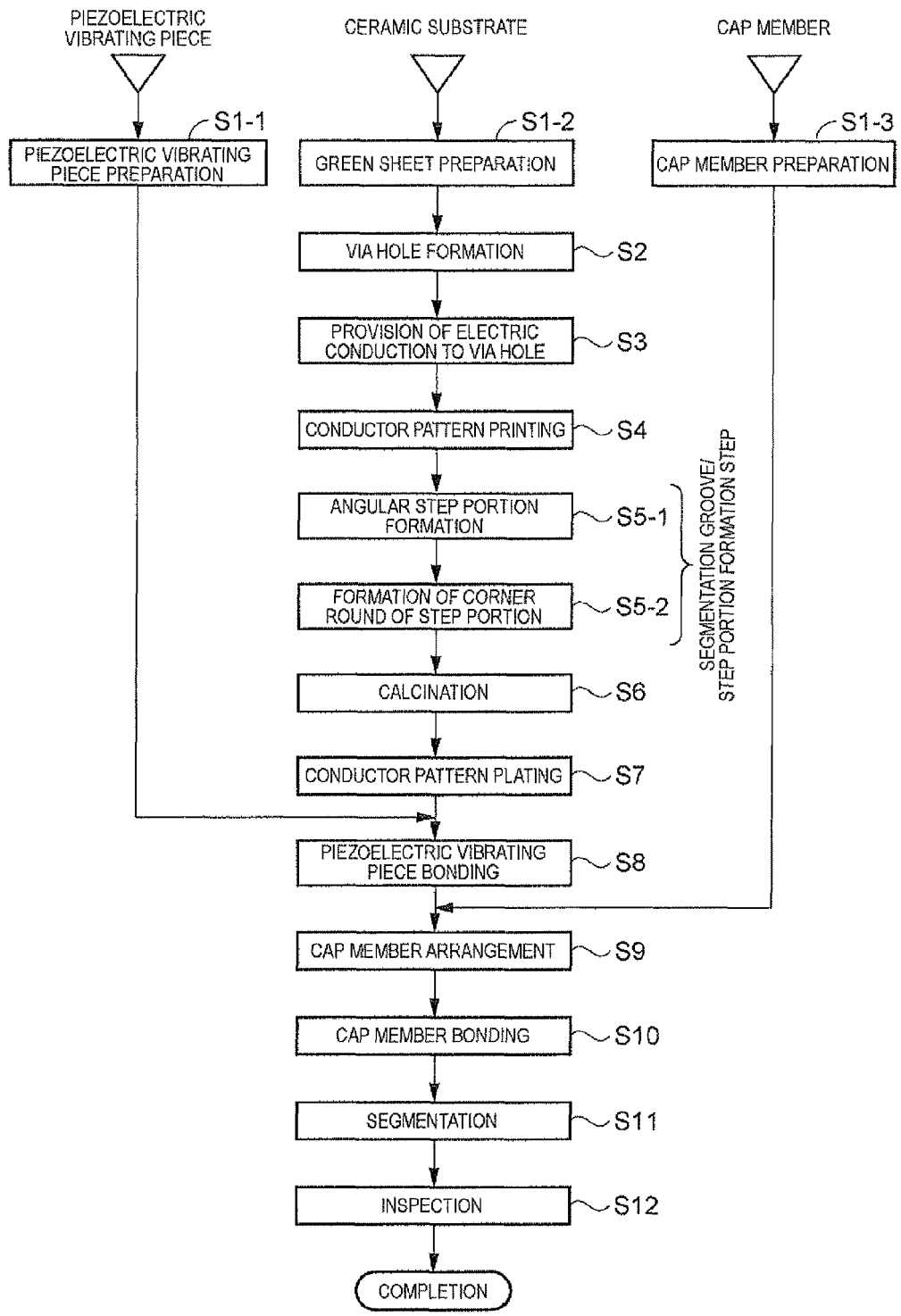
FIG. 18 is a flowchart illustrating a method of manufacturing a piezoelectric device of the third embodiment.
Figure 19:
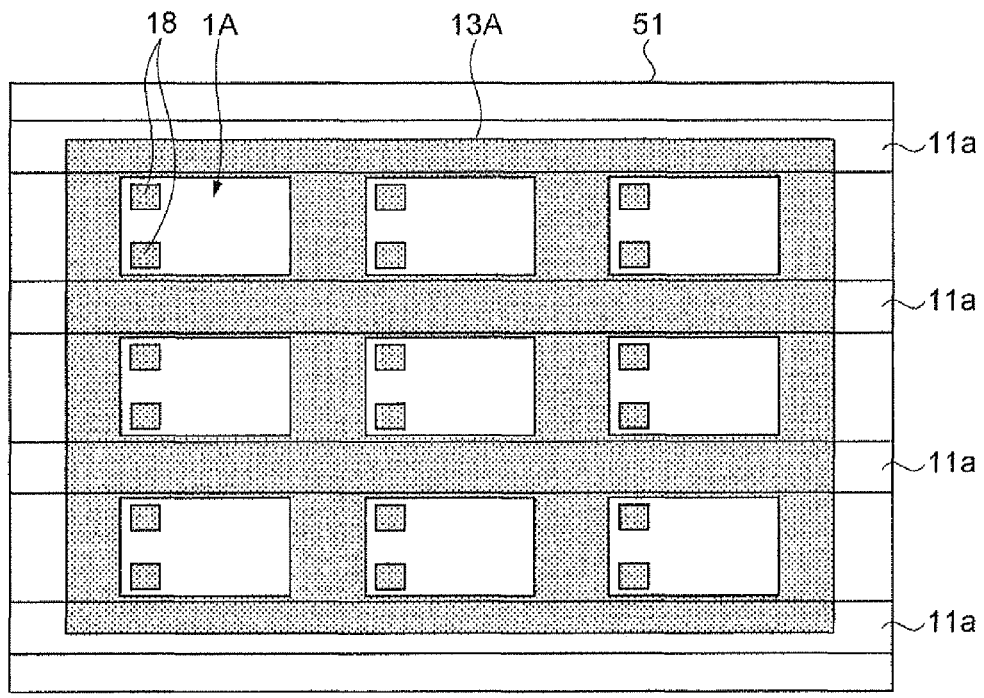
FIG. 19 is a schematic plan view showing a process for manufacturing a ceramic substrate as a third embodiment.
Figure 20:
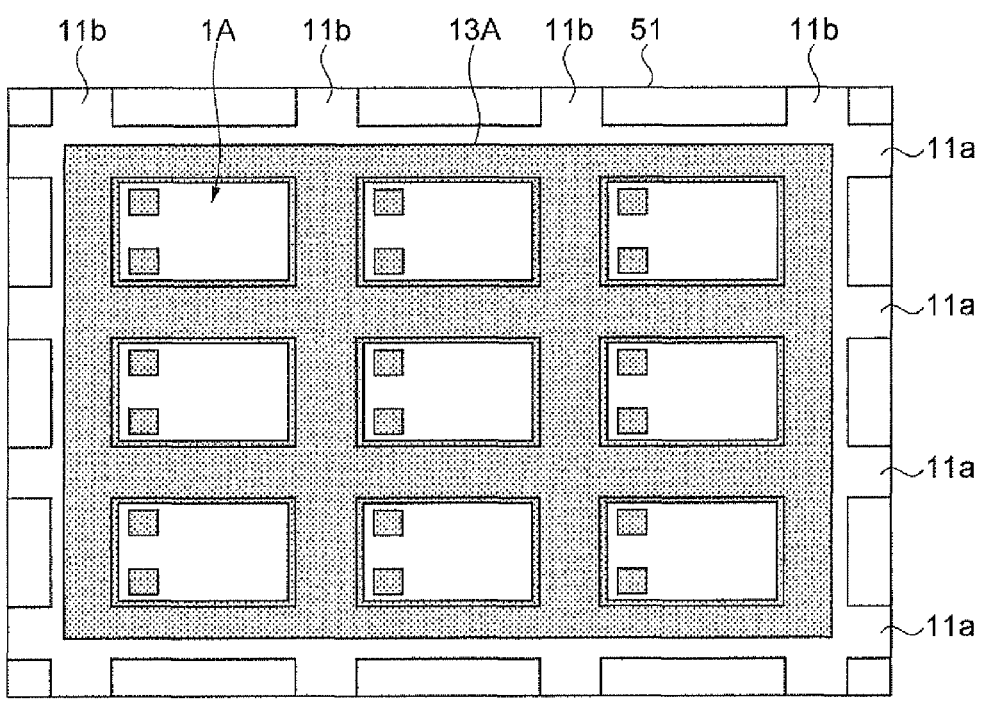
FIG. 20 is a schematic plan view showing a process for manufacturing a ceramic substrate as the third embodiment.

FIG. 18 is a flowchart illustrating a method of manufacturing a piezoelectric device according to the third embodiment in which the shape of a step portion is formed in multiple times. FIGS. 19 and 20 are schematic plan views illustrating a process for forming a step portion in a green sheet in multiple times using a plurality of types of pressing blades. As the drawing of a green sheet in a state where a step portion is completed, FIG. 5 used in describing the above-described embodiments is referenced. In the flowchart of FIG. 18 or in the green sheet shown in FIGS. 19 and 20, the same parts as those in the above-described embodiments are represented by the same reference numerals, and description thereof will be omitted.

In the segmentation groove and step portion formation step (Step S5 of FIG. 3) of this example, first, as shown in Step S5-1 of FIG. 18, an angular step portion is formed. In this example, description will be provided as to a method of forming an angular step portion in two stages.

That is, through the steps up to the conductor pattern printing step (Step S4) in the method of manufacturing the piezoelectric device 1 according to the above-described embodiment, on the green sheet 51 (see FIG. 4) on which the conductor pattern 13A is formed as the original form of the vibrating piece bonding terminals 18 or the metal layer 13, as shown in FIG. 19, first, a plurality of step portions 11a are formed as the contour in either a horizontal direction or a vertical direction of regions for forming the step portions 11 in a plurality of piezoelectric device forming regions 1A arranged in a matrix. This example shows an example where a step portion 11a is initially formed as the contour in the longitudinal direction of the region for forming the step portion 11 in each piezoelectric device forming region 1A.

Although FIG. 19 shows an example where four columns of step portions 11a are formed in the green sheet 51, the four columns of step portions 11a may be formed through collective pressing with a pressing blade having a shape capable of forming the four columns of step portions 11a. In this case, it is possible to further shorten the processing time.

The four columns of step portions 11a may be formed through pressing in four times with a pressing blade having a shape capable of forming one column of step portions 11a. The four columns of step portions 11a may be formed through pressing in twice with a pressing blade capable of forming two columns of step portions 11a. As such, when the method is used in which the step portions 11a are formed in multiple times with a pressing blade capable of forming the step portions 11a by the divisor of the number of columns of the step portions 11a to be finally formed, the pressing blade can be generalized, the pressure which is applied to the pressing blade at the time of single pressing can be lowered, and the forming position can be adjusted for each single step portion 11a, making it easy to stabilize the position accuracy or shape of the step portions 11a.

Next, as shown in FIG. 20, a plurality of step portions 11b are formed as the other contour different from the above-described step portions 11a out of the horizontal and vertical contour of the step portions 11 in a plurality of piezoelectric device forming regions 1A.

Although FIG. 20 shows an example where four columns of step portions 11b are formed in the green sheet 51, similarly to the above-described step portions 11a, the four columns of step portions 11b may be formed through collective pressing with a pressing blade having a shape capable of forming the four columns of step portions 11b, or may be formed in multiple times with a pressing blade capable of forming the step portions 11b by the divisor of the number of columns of the step portions 11b to be finally formed.

Through the above-described steps, out of the regions for forming the step portions 11 of the respective piezoelectric device forming regions 1A in the green sheet 51, next, as shown in Step 55-2, pressing is carried out with a pressing blade capable of molding the corner portions in an arc shape in the rectangular step portions 11a or 11b in which the corner portions are not formed in an arc shape in plan view. Thus, as shown in FIG. 5, the formation of the step portions 11, in which the corner portions are formed in an arc shape, in the respective piezoelectric device forming regions 1A is completed.

In the pressing of this step, collective pressing may be carried out to form all the corner portions of the green sheet 51 in an arc shape with a pressing blade having a shape capable of molding the corner portions in an arc shape. The corner portions of the green sheet 51 may be formed in multiple times with a pressing blade capable of molding a part of the corner portions in an arc shape.

With the method of manufacturing a piezoelectric device according to the third embodiment, in forming the step portions 11 through pressing with a pressing blade, pressing is carried out in multiple times, such that the pressure to be applied at the time of single pressing is lowered. Therefore, it is possible to reduce damage to the green sheet 51 and to minutely adjust the forming position for each corner portion, stabilizing the shape.

Although the embodiments of the invention made by the inventors have been described specifically, the invention is not limited to the above-described embodiments and modifications, and various alterations may be made without departing from the spirit of the invention.

For example, in the above-described embodiments and modifications, an example has been described where the ceramic substrate 10 as a substrate is formed of a single-layered green sheet 51 (ceramic sheet 51A).

However, the invention is not limited thereto. In manufacturing a ceramic substrate from a green sheet, a multilayer substrate may be used which is formed by laminating a plurality of green sheets 51 with a conductive pattern described in the above-described embodiments.

In this case, a plurality of green sheets are prepared through the green sheet preparation of Step S1-2 and the drilling of Step S2 to the conductor pattern printing of Step S4 of FIG. 3 described in the above-described embodiments. Then, a plurality of green sheets are laminated and temporarily tacked, then the segmentation groove/step portion formation of Step S5 is performed, and subsequently the calcination of Step S6 is performed. Thus, a multilayer ceramic substrate having step portions can be obtained.

In the above-described embodiments and modifications, an example has been described where the cap member 19 made of a metal is used, the metal layer 13 or 213 is provided on the step portion 11 or 211 and the wall surface 12, 12A, 112, 112A, 212, or 212A of the ceramic substrate 10, and the cap member 19 and the ceramic substrate 10 are bonded to each other through the soldering material 29 made of a metal or alloy. Bonding (soldering) through a soldering material indicates a method in which the soldering material 29 made of a metal or alloy having a melting point lower than the base material (the cap member 19 and the metal layer 13 or 213) is used as a bonding member, and the soldering material 29 is molten for bonding. For example, this method includes a method in which the soldering material is supplied before bonding between the contact portions of the cap member 19 and the ceramic substrate 10, and molten, a method in which a layer of a metal or alloy for forming the soldering material 29 is formed on both or one of the cap member 19 and the ceramic substrate 10.

In the embodiments of the invention, the bonding member used in bonding the cap member 19 and the ceramic substrate 10 is not limited to the bonding member made of a metal or alloy in the above-described embodiments and modifications. For example, low-melting-point glass or an organic (resin-based) adhesive may be bonded as a bonding member. In this case, it is not necessary that the cap member 19 is made of a metal and that the metal layer 13 or 213 is formed on the step portion 11 or 211 and the wall surface 12, 12A, 112, 112A, 212, or 212A.

A specific form described in the above-described embodiments and modifications, for example, the shape of the ceramic substrate 10 or the green sheet 51, the piezoelectric vibrating piece 20 as an electronic component, or the like is not limited.

Similarly, the position or shape of each electrode, wiring line or terminal is not limited to those in the above-described embodiments and modifications.

Although in the above-described embodiments and modifications, the piezoelectric device 1, 100, 101, 201, 301, or 401 on which the piezoelectric vibrating piece 20 as an electronic component is mounted has been described as an example of electronic apparatus, the invention is not limited thereto. The configuration shown in the above-described embodiments and modifications may be applied to various electronic apparatus in which various electronic components, such as a semiconductor circuit device, as an electronic component are bonded to a substrate, and the electronic component is sealed airtight with a cap member.

The entire disclosure of Japanese Patent Application Nos: 2010-016373, filed Jan. 28, 2010 and 2010-007862 filed Jan. 18, 2010 are expressly incorporated by reference herein.

What is claimed is:

1. An electronic apparatus comprising:
    a substrate which has a step portion in an edge portion;
    an electronic component which is bonded to a surface of the substrate inward of the step portion of the substrate;
    a cap member which is bonded to the step portion and a wall surface so as to seal the electronic component; and
    a metal layer disposed between the cap member and the substrate in a bonding region along the step portion and the wall surface,
    wherein part of the metal layer is placed on top of the surface of the substrate to which the electronic component is bonded, and
    wherein a wall surface of the step portion is formed to be inclined from the step portion toward an electronic component bonding region or to be perpendicular to the step portion.
2. The electronic apparatus according to claim 1, wherein a connection portion of the wall surface and the step portion has an arc-shaped sectional shape.
3. The electronic apparatus according to claim 1, wherein the shape of the surface inward of the step portion is substantially the same as the shape of an opening of the cap member in plan view.
4. The electronic apparatus according to claim 1, wherein the cap member has a metal or a metal film in at least a contact portion with the substrate.
5. The electronic apparatus according to claim 1, wherein the entire wall surface of the step portion is formed to be inclined from the step portion toward an electronic component bonding region.

* * * * *